US012772748B2

(12) United States Patent
Kawaguchi et al.

(10) Patent No.: US 12,772,748 B2
(45) Date of Patent: Oct. 20, 2026

(54) QUANTUM DEVICE AND METHOD FOR CONTROLLING QUANTUM DEVICE

(71) Applicant: FUJITSU LIMITED, Kawasaki (JP)

(72) Inventors: Kenichi Kawaguchi, Ebina (JP); Manabu Ohtomo, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 324 days.

(21) Appl. No.: 18/738,105

(22) Filed: Jun. 10, 2024

(65) Prior Publication Data

US 2024/0349627 A1 Oct. 17, 2024

Related U.S. Application Data

(63) Continuation of application No. PCT/JP2022/000309, filed on Jan. 7, 2022.

(51) Int. Cl.

*H10N 60/12* (2023.01)
*G06N 10/40* (2022.01)
*H10N 60/85* (2023.01)

(52) U.S. Cl.

CPC ............. *H10N 60/12* (2023.02); *H10N 60/85* (2023.02); *G06N 10/40* (2022.01)

(58) Field of Classification Search

CPC ........ H10N 60/12; H10N 60/85; H10N 69/00; G06N 10/40
USPC ................... 326/3; 257/36, 34, 200, 663, 31
See application file for complete search history.

(56) References Cited

U.S. PATENT DOCUMENTS 9,040,959 B2 5/2015 Lutchyn et al.
10,346,761 B2 7/2019 Clarke et al.
11,934,917 B2 * 3/2024 Posske .................. H10N 60/20
2019/0220769 A1 7/2019 Pikulin
(Continued)

FOREIGN PATENT DOCUMENTS

JP 2013-247267 A 12/2013
JP 2020-96107 A 6/2020

OTHER PUBLICATIONS

Heck, B van et al., "Minimal circuit for a flux-controlled Majorana qubit in a quantum spin-Hall insulator", Physica Scripta, T164, No. 014007, pp. 1-8, Aug. 25, 2015.
(Continued)

*Primary Examiner* — Arnold M Kinkead
(74) *Attorney, Agent, or Firm* — Fujitsu Intellectual Property Center

(57) ABSTRACT

A quantum device includes: a $WTe_2$ layer; a first insulating layer; a second insulating layer; a first to third normal conducting metal electrodes; a first control circuit that controls a potential of the normal conducting metal electrodes; superconducting metal wiring; and a second control circuit that controls a superconducting phase difference of the superconducting metal wiring. The $WTe_2$ layer has a first edge and a second edge that constitute a constricted portion, the constricted portion is provided between the first edge and the second edge, the first normal conducting metal electrode overlaps a portion of the first edge away from the constricted portion to one side, the second normal conducting metal electrode overlaps a portion of the first edge away from the constricted portion to another side, and the third normal conducting metal electrode overlaps a portion of the second edge away from the constricted portion to one side.

18 Claims, 27 Drawing Sheets

(56) References Cited

U.S. PATENT DOCUMENTS

| | | | | |
|---|---|---|---|---|
| 2020/0320420 | A1 | 10/2020 | Hart et al. | |
| 2024/0030328 | A1* | 1/2024 | Knapp | H10D 30/473 |

OTHER PUBLICATIONS

WIPO—International Search Report with English language translation and Written Opinion mailed on Mar. 15, 2022 for International Application No. PCT/JP2022/000309, 10 pages.

* cited by examiner

QUANTUM DEVICE AND METHOD FOR CONTROLLING QUANTUM DEVICE

CROSS-REFERENCE TO RELATED APPLICATION

This application is a continuation application of International Application PCT/JP2022/000309 filed on Jan. 7, 2022 and designated the U.S., the entire contents of which are incorporated herein by reference.

FIELD

The present disclosure discussed herein is related to a quantum device and a method for controlling a quantum device.

BACKGROUND

As a quantum computer having error resistance, it is expected to achieve a quantum computer (topological quantum computer) including a topological quantum bit using position exchange (braiding) of a Majorana particle. The topological quantum bit needs a function of performing the position exchange without causing a collision among four Majorana particles. Proposed is a quantum device that controls positions of Majorana particles by changing a magnetic flux with respect to a structure including a two-dimensional topological material and a superconducting metal.

Japanese Laid-open Patent Publication No. 2020-96107, U.S. Pat. Nos. 9,040,959, 10,346,761, and Phys. Scr. T164 (2015) 014007 are disclosed as related art.

SUMMARY

According to an aspect of the embodiments, a quantum device includes: a $WTe_2$ layer that has a first surface and a second surface on an opposite side of the first surface; a first insulating layer provided over the first surface; a second insulating layer provided over the second surface; a first normal conducting metal electrode, a second normal conducting metal electrode, and a third normal conducting metal electrode provided above the first insulating layer; a first control circuit that controls a potential of the first normal conducting metal electrode, the second normal conducting metal electrode, and the third normal conducting metal electrode; superconducting metal wiring that is provided above the second insulating layer and has a first end and a second end; and a second control circuit that controls a superconducting phase difference between the first end and the second end. In planar view from a direction perpendicular to the first surface, the $WTe_2$ layer has a first edge and a second edge that constitute a constricted portion, the constricted portion is provided between the first edge and the second edge, the first normal conducting metal electrode overlaps a portion of the first edge away from the constricted portion to one side, the second normal conducting metal electrode overlaps a portion of the first edge away from the constricted portion to another side, and the third normal conducting metal electrode overlaps a portion of the second edge away from the constricted portion to one side.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
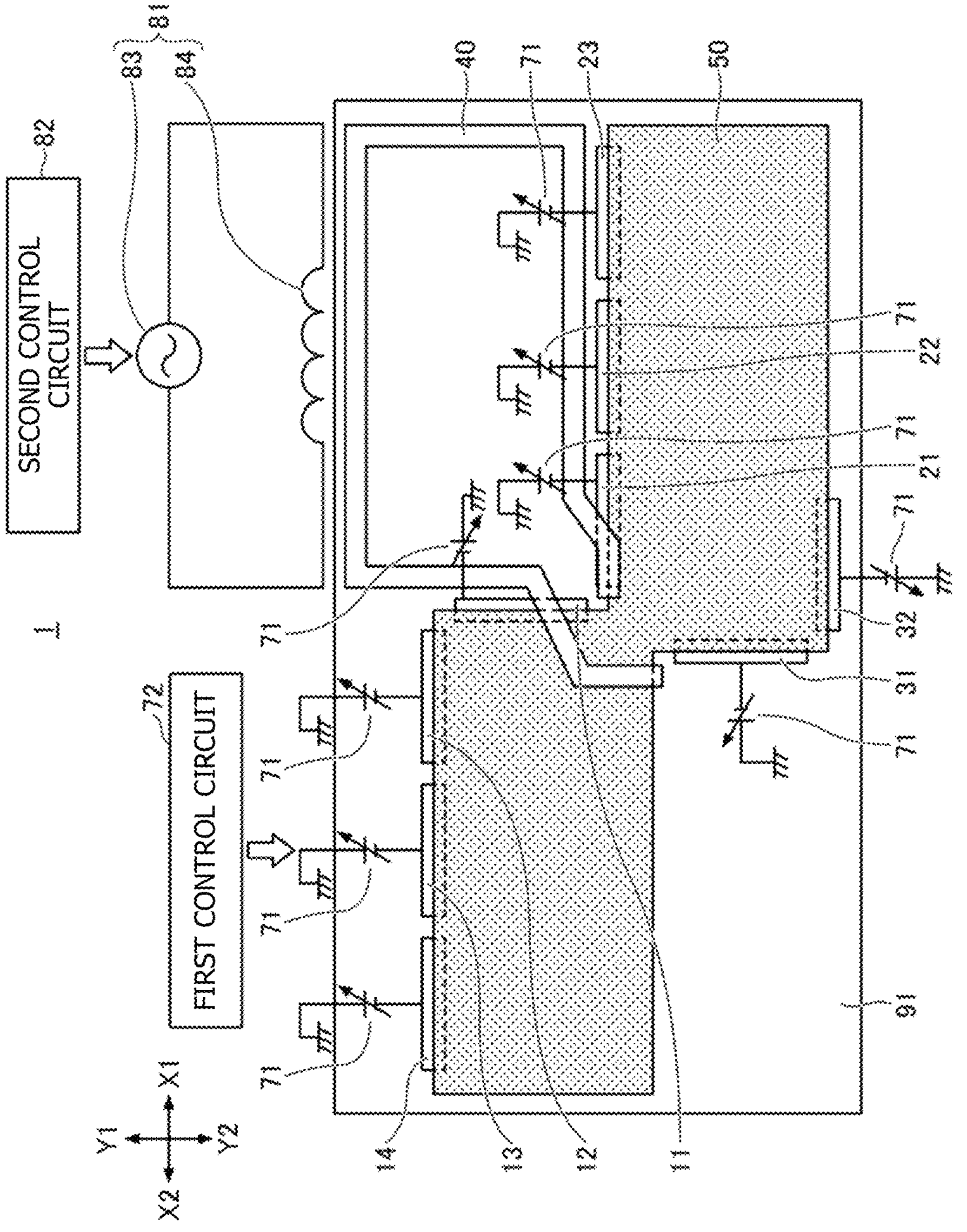
FIG. 1 is a schematic diagram illustrating a quantum device according to a first embodiment.

For example, it is not easy to stably manufacture the quantum device disclosed in Phys. Scr. T164 (2015) 014007.

An object of the present disclosure is to provide a quantum device that may be stably manufactured and a method for controlling the quantum device.

Hereinafter, embodiments of the present disclosure will be specifically described with reference to the accompanying drawings. Note that, in the present specification and drawings, components having substantially the same functional configurations are denoted by the same reference numerals, and redundant descriptions may be omitted. In the present disclosure, it is assumed that an X1-X2 direction, a Y1-Y2 direction, and a Z1-Z2 direction are directions orthogonal to one another. A plane including the X1-X2 direction and the Y1-Y2 direction is described as an XY plane, a plane including the Y1-Y2 direction and the Z1-Z2 direction is described as a YZ plane, and a plane including the Z1-Z2 direction and the X1-X2 direction is described as a ZX plane. Note that, for convenience, it is assumed that the Z1-Z2 direction is set as a vertical direction, a Z1 side is set as an upper side, and a Z2 side is set as a lower side. Furthermore, a planar view refers to viewing an object from the Z1 or Z2 side, and a planar shape refers to a shape of the object viewed from the Z1 side.

First Embodiment

Figure 2:
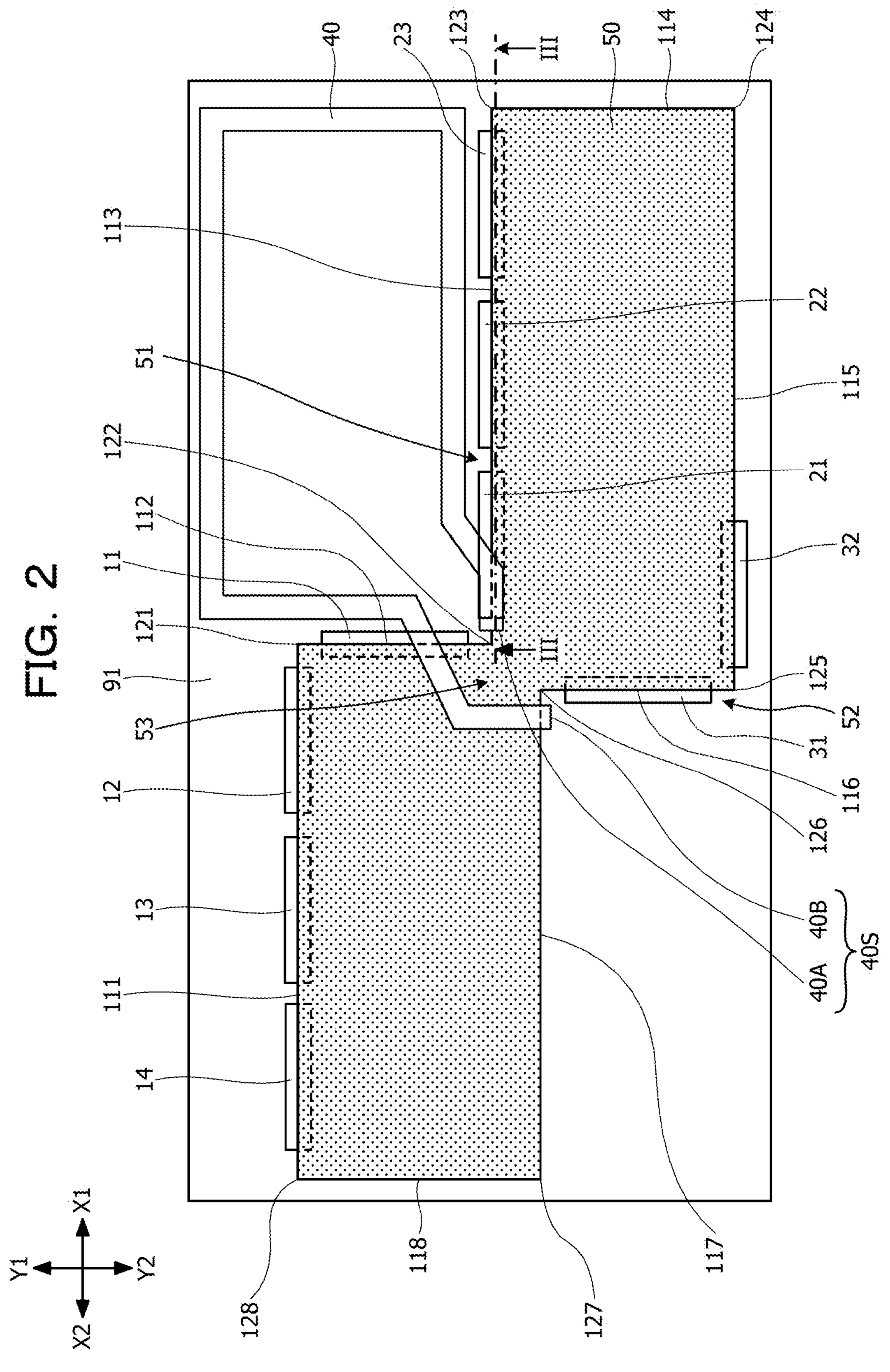
FIG. 2 is a top view illustrating a part of the quantum device according to the first embodiment.
Figure 3:
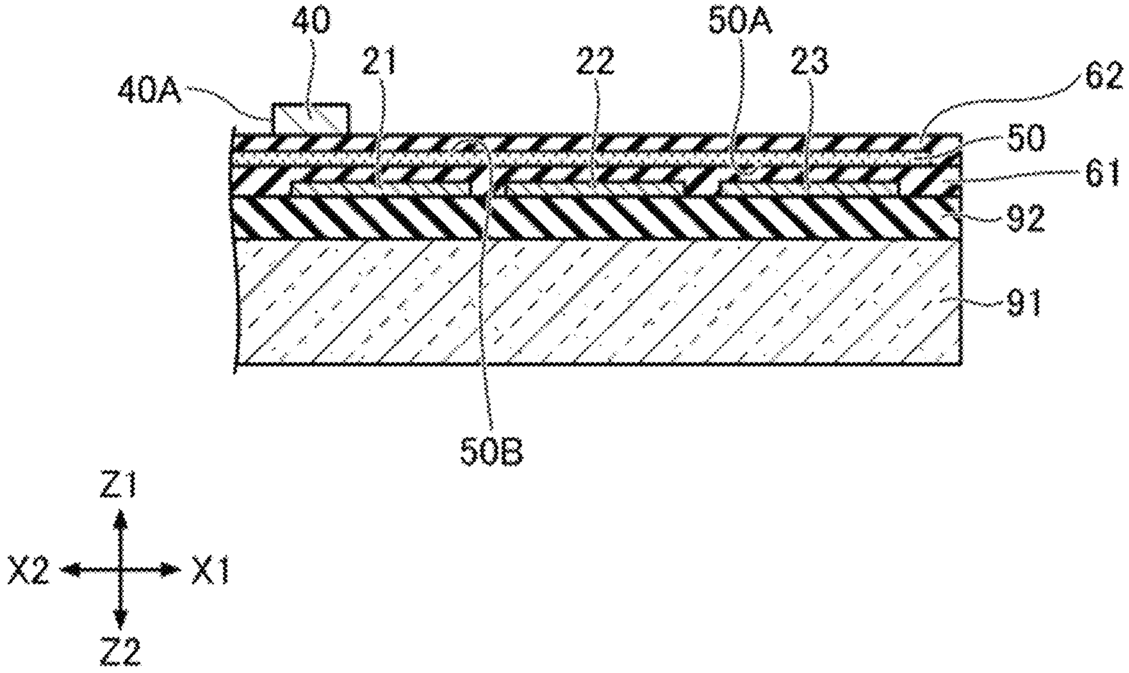
FIG. 3 is a cross-sectional view illustrating the quantum device according to the first embodiment.

First, a first embodiment will be described. The first embodiment relates to a quantum device. FIG. 1 is a schematic diagram illustrating the quantum device according to the first embodiment. FIG. 2 is a top view illustrating a part of the quantum device according to the first embodiment. FIG. 3 is a cross-sectional view illustrating the quantum device according to the first embodiment. In FIGS. 1 and 2, an insulating layer is omitted for convenience. FIG. 3 corresponds to a cross-sectional view taken along line II-II in FIG. 2.

As illustrated in FIGS. 1 to 3, a quantum device 1 according to the first embodiment includes a substrate 91, an insulating layer 92, first normal conducting metal electrodes 11 to 14, second normal conducting metal electrodes 21 to 23, third normal conducting metal electrodes 31 and 32, an insulating layer 61, a $WTe_2$ layer 50, an insulating layer 62, and a superconducting metal loop 40. The quantum device 1 further includes a first control unit and a second control unit.

The insulating layer 92 is provided over the substrate 91. For example, the substrate 91 is a Si substrate, and the insulating layer 92 is a $SiO_2$ layer. A laminated body of the substrate 91 and the insulating layer 92 may be a substrate with an oxide layer.

The first normal conducting metal electrodes 11 to 14, the second normal conducting metal electrodes 21 to 23, and the third normal conducting metal electrodes 31 and 32 are provided above the insulating layer 92. The first normal conducting metal electrodes 11 to 14, the second normal conducting metal electrodes 21 to 23, and the third normal conducting metal electrodes 31 and 32 are, for example, Au electrodes or Pd electrodes. The first normal conducting metal electrodes 11 to 14, the second normal conducting metal electrodes 21 to 23, and the third normal conducting metal electrodes 31 and 32 have a thickness of equal to or more than 10 nm and equal to or less than 30 nm, for example. A Ti film having a thickness of several nm may be provided between the insulating layer 92 and the first normal conducting metal electrodes 11 to 14, the second normal conducting metal electrodes 21 to 23, and the third normal conducting metal electrodes 31 and 32. Arrangement of the first normal conducting metal electrodes 11 to 14, the second normal conducting metal electrodes 21 to 23, and the third normal conducting metal electrodes 31 and 32 will be described later.

The insulating layer 61 is provided over the insulating layer 92 to cover the first normal conducting metal electrodes 11 to 14, the second normal conducting metal electrodes 21 to 23, and the third normal conducting metal electrodes 31 and 32. The insulating layer 61 is, for example, a hexagonal boron nitride (h-BN) layer. The insulating layer 61 has a thickness of, for example, 30 nm. The insulating layer 61 is an exemplary first insulating layer.

The $WTe_2$ layer 50 is provided over the insulating layer 61. $WTe_2$ is a layered material. The $WTe_2$ layer 50 includes one or a plurality of $WTe_2$ laminated to each other. In a case where the $WTe_2$ layer 50 includes a single layer of $WTe_2$, the $WTe_2$ layer 50 has a helical edge channel. In a case where the $WTe_2$ layer 50 includes a plurality of layers of $WTe_2$, the $WTe_2$ layer 50 has a hinge channel.

The $WTe_2$ layer 50 includes a lower surface 50A and an upper surface 50B on the opposite side of the lower surface 50A. The insulating layer 61 covers the lower surface 50A of the $WTe_2$ layer 50. Furthermore, the first normal conducting metal electrodes 11 to 14, the second normal conducting metal electrodes 21 to 23, and the third normal conducting metal electrodes 31 and 32 are provided to cover the insulating layer 61 with the $WTe_2$ layer 50. The lower surface 50A is an exemplary first surface.

The $WTe_2$ layer 50 has, for example, an octagonal planar shape in which two rectangles partially overlap. In planar view, the $WTe_2$ layer 50 has sides 111 to 118 and vertexes 121 to 128. The sides 111, 113, 115, and 117 are parallel to the X1-X2 direction, and the sides 112, 114, 116, and 118 are parallel to the Y1-Y2 direction.

The vertex 121 is an intersection point of the side 111 and the side 112. The side 111 extends from the vertex 121 to the X2 side, and the side 112 extends from the vertex 121 to the Y2 side. The vertex 122 is an intersection point of the side 112 and the side 113. The side 112 extends from the vertex 122 to the Y1 side, and the side 113 extends from the vertex 122 to the X1 side. The vertex 123 is an intersection point of the side 113 and the side 114. The side 113 extends from the vertex 123 to the X2 side, and the side 114 extends from the vertex 123 to the Y2 side. The vertex 124 is an intersection point of the side 114 and the side 115. The side 114 extends from the vertex 124 to the Y1 side, and the side 115 extends from the vertex 124 to the X2 side. The vertex 125 is an intersection point of the side 115 and the side 116. The side 115 extends from the vertex 125 to the X1 side, and the side 116 extends from the vertex 125 to the Y1 side. The vertex 126 is an intersection point of the side 116 and the side 117. The side 116 extends from the vertex 126 to the Y2 side, and the side 117 extends from the vertex 126 to the X2 side. The vertex 127 is an intersection point of the side 117 and the side 118. The side 117 extends from the vertex 127 to the X1 side, and the side 118 extends from the vertex 127 to the Y1 side. The vertex 128 is an intersection point of the side 118 and the side 111. The side 118 extends from the vertex 128 to the Y2 side, and the side 111 extends from the vertex 128 to the X1 side.

A distance between the vertex 122 and the vertex 126 is, for example, equal to or more than 50 nm and equal to or less than 500 nm, and the $WTe_2$ layer 50 has a planar shape constricted in the vicinity of the vertexes 122 and 126. The $WTe_2$ layer 50 has a first edge 51 including the sides 111 to 113, and a second edge 52 including the sides 115 and 116. The first edge 51 and the second edge 52 constitute a constricted portion 53 in the vicinity of the vertexes 122 and 126. The distance between the vertex 122 and the vertex 126 is preferably equal to or more than 100 nm and equal to or less than 450 nm, and more preferably equal to or more than 150 nm and equal to or less than 400 nm.

The first normal conducting metal electrodes 11 to 14 overlap a portion (sides 111 and 112) of the first edge 51 away from the constricted portion 53 to one side in planar view. For example, the first normal conducting metal electrode 11 overlaps the side 112, and the first normal conducting metal electrodes 12 to 14 overlap the side 111. The first normal conducting metal electrodes 12 to 14 are arranged in this order from the vertex 121 toward the vertex 128. A length of the first normal conducting metal electrodes 11 to 14 in the direction along the first edge 51 is, for example, equal to or more than 100 nm and equal to or less than 500 nm, preferably equal to or more than 150 nm and equal to or less than 450 nm, and more preferably equal to or more than 200 nm and equal to or less than 400 nm. Furthermore, an interval between the first normal conducting metal electrodes 11 to 14 in the direction long the first edge 51 is, for example, equal to or more than 30 nm and equal to or less than 100 nm, preferably equal to or more than 40 nm and equal to or less than 90 nm, and more preferably equal to or more than 50 nm and equal to or less than 80 nm.

The second normal conducting metal electrodes 21 to 23 overlap a portion (side 113) of the first edge 51 away from the constricted portion 53 to another side in planar view. For example, the second normal conducting metal electrodes 21 to 23 overlap the side 113. The second normal conducting metal electrodes 21 to 23 are arranged in this order from the vertex 122 toward the vertex 123. A length of the second normal conducting metal electrodes 21 to 23 in the direction along the first edge 51 is, for example, equal to or more than 100 nm and equal to or less than 500 nm, preferably equal to or more than 150 nm and equal to or less than 450 nm, and more preferably equal to or more than 200 nm and equal to or less than 400 nm. Furthermore, an interval between the second normal conducting metal electrodes 21 to 23 in the direction long the first edge 51 is, for example, equal to or more than 30 nm and equal to or less than 100 nm, preferably equal to or more than 40 nm and equal to or less than 90 nm, and more preferably equal to or more than 50 nm and equal to or less than 80 nm.

The third normal conducting metal electrodes 31 and 32 overlap a portion (sides 115 and 116) of the second edge 52 away from the constricted portion 53 to one side in planar view. For example, the third normal conducting metal electrode 31 overlaps the side 116, and the third normal conducting metal electrode 32 overlaps the side 115. A length of the third normal conducting metal electrodes 31 and 32 in the direction along the second edge 52 is, for example, equal to or more than 100 nm and equal to or less than 500 nm, preferably equal to or more than 150 nm and equal to or less than 450 nm, and more preferably equal to or more than 200 nm and equal to or less than 400 nm. Furthermore, an interval between the third normal conducting metal electrodes 31 and 32 in the direction long the second edge 52 is, for example, equal to or more than 30 nm and equal to or less than 100 nm, preferably equal to or more than 40 nm and equal to or less than 90 nm, and more preferably equal to or more than 50 nm and equal to or less than 80 nm.

The insulating layer 62 is provided over the insulating layer 92 to cover the $WTe_2$ layer 50. The insulating layer 62 is, for example, an h-BN layer. A thickness of the insulating layer 62 is preferably equal to or less than 10 nm, more preferably equal to or less than 5 nm, and still more preferably equal to or less than 3 nm. The lower limit of the thickness of the insulating layer 62 is, for example, 1 nm. The insulating layer 62 covers the upper surface 50B of the $WTe_2$ layer 50. The upper surface 50B is an exemplary second surface. The insulating layer 62 is an exemplary second insulating layer.

The superconducting metal loop 40 is provided above the insulating layer 62. A material of the superconducting metal loop 40 is, for example, Al or Nb. A slit 40S is formed in the superconducting metal loop 40, and the superconducting metal loop 40 includes a first end 40A and a second end 40B sandwiching the slit 40S therebetween. The slit 40S overlaps the constricted portion 53 in planar view. Furthermore, the superconducting metal loop 40 is provided to cover the insulating layer 62 with the $WTe_2$ layer 50.

The first control unit includes a direct current (DC) power supply 71 individually coupled to each of the first normal conducting metal electrodes 11 to 14, the second normal conducting metal electrodes 21 to 23, and the third normal conducting metal electrodes 31 and 32, and a first control circuit 72 that controls the DC power supply 71.

The second control unit includes an alternating current (AC) circuit 81, and a second control circuit 82 that controls the AC circuit 81. The AC circuit 81 includes an AC power supply 83 and an inductor 84 through which a current flows from the AC power supply 83. The inductor 84 is disposed in the vicinity of the superconducting metal loop 40. A magnetic field formed by the inductor 84 changes a magnetic flux in the superconducting metal loop 40. For example, the second control unit controls a superconducting phase difference between the first end 40A and the second end 40B by changing the magnetic flux in the superconducting metal loop 40.

In the quantum device 1, a phase change between a topological insulator and a superconductor occurs in the $WTe_2$ layer 50 according to a carrier concentration at a cryogenic temperature of equal to or lower than 4 K, for example, equal to or lower than 1 K. For example, when a voltage equal to or higher than a threshold value is applied the first normal conducting metal electrode 11, carriers are induced in the vicinity of the first normal conducting metal electrode 11, and the $WTe_2$ layer 50 becomes a superconductor. On the other hand, when the voltage equal to or higher than the threshold value is no longer applied, the $WTe_2$ layer 50 becomes a topological insulator in the vicinity of the first normal conducting metal electrode 11. Hereinafter, a state in which the voltage equal to or higher than the threshold value is applied to the normal conducting metal electrode may be referred to as an ON state, and a state in which the voltage equal to or higher than the threshold value is not applied may be referred to as an OFF state.

Furthermore, when there are a portion of the superconductor and a portion of the topological insulator in the $WTe_2$ layer 50, a Majorana particle is generated on the topological insulator side of the boundary between the portion of the superconductor and the portion of the topological insulator at the edge of the $WTe_2$ layer 50. Therefore, a position of the Majorana particle may be adjusted by selecting the normal conducting metal electrode to be set in the ON state by the first control unit and shifting the boundary between the portion of the superconductor and the portion of the topological insulator.

Moreover, positions of the Majorana particle above the first edge 51 and the Majorana particle above the second edge 52 may be exchanged in the vicinity of the constricted portion 53 by controlling the superconducting phase difference between the first end 40A and the second end 40B using the second control unit.

Figure 4:
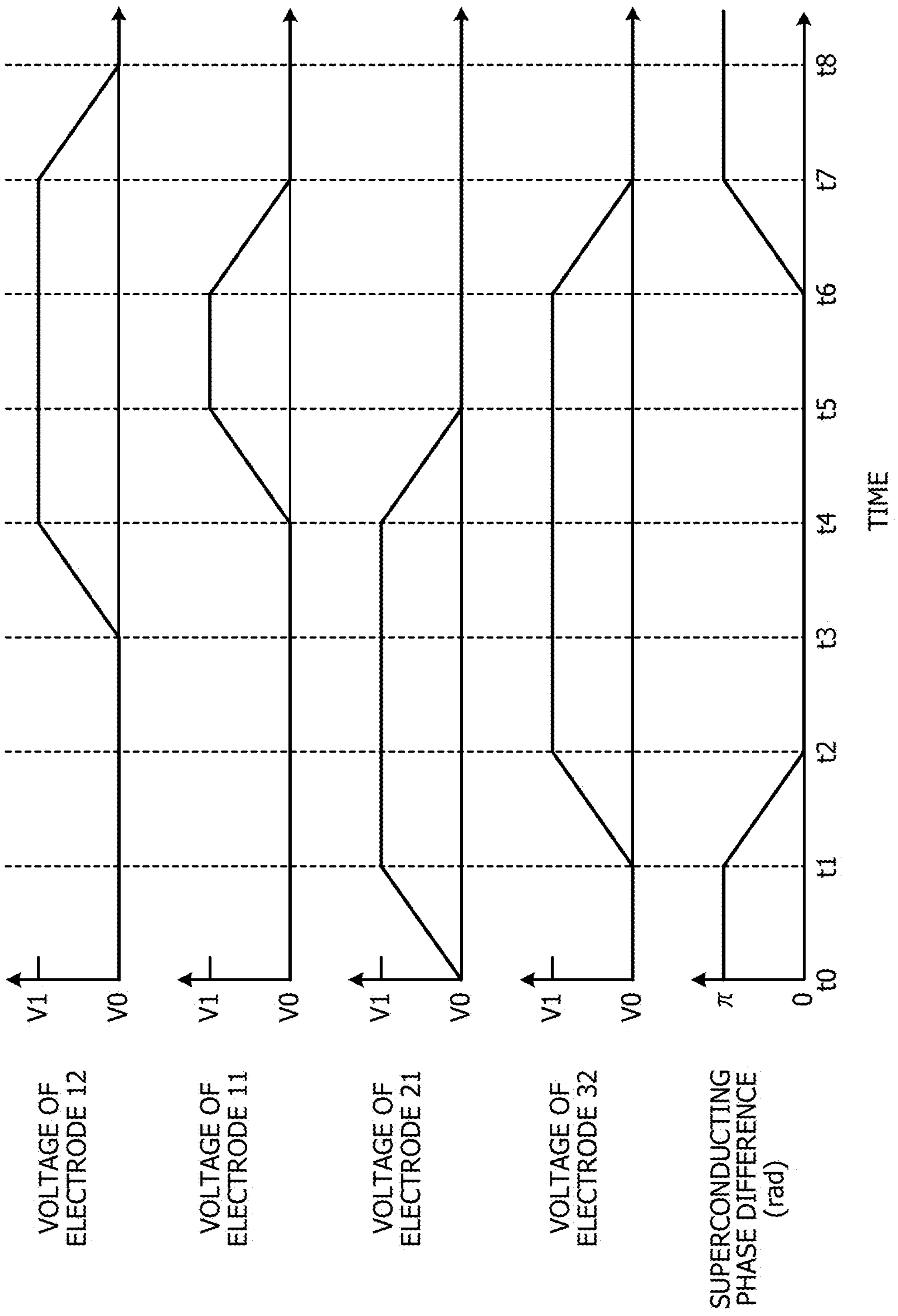
FIG. 4 is a timing chart illustrating an exemplary method for controlling the quantum device according to the first embodiment.

Next, an exemplary method for controlling the quantum device 1 according to the first embodiment will be described. FIG. 4 is a timing chart illustrating an exemplary method for controlling the quantum device 1 according to the first embodiment. FIGS. 5 to 12 are schematic diagrams illustrating a change in a state of a Majorana particle. In this example, it is assumed that the first normal conducting metal electrodes 13 and 14, the second normal conducting metal electrodes 22 and 23, and the third normal conducting metal electrode 31 are in the ON state at all times under the control of the first control unit. FIG. 4 illustrates a change in the voltage of the first normal conducting metal electrodes 11 and 12, the second normal conducting metal electrode 21, and the third normal conducting metal electrode 32, and a change in the superconducting phase difference between the first end 40A and the second end 40B. A voltage V0 in FIG. 4 is lower than the threshold value, and a voltage V1 is equal to or higher than the threshold value. In FIGS. 5 to 12, electrodes in the ON state are indicated by thick lines. In FIGS. 5 to 12, an ellipse surrounding two Majorana particles indicates that those two Majorana particles are coupled, and a broken line ellipse indicates that the coupling is weaker than a solid line ellipse. Furthermore, in FIGS. 5 to 12, a broken line arrow indicates tunneling of the Majorana particle, and a dash-dot-dot line arrow indicates movement of the Majorana particle.

Note that, while the Majorana particle is generated at the edge of the $WTe_2$ layer as described above, hereinafter, the position of the Majorana particle may be described with reference to the normal conducting metal electrode. For example, the position of the Majorana particle may be described based on a planar view.

In this example, as illustrated in FIG. 4, it is assumed that the first normal conducting metal electrodes 11 and 12, the second normal conducting metal electrode 21, and the third normal conducting metal electrode 32 are in the OFF state under the control of the first control unit in an initial state at time t0. In this case, the $WTe_2$ layer 50 becomes a superconductor in the vicinity of the first normal conducting metal electrodes 13 and 14 so that the Majorana particle is generated on the X2 side of the first normal conducting metal electrode 14, and the Majorana particle is generated between the first normal conducting metal electrode 13 and the first normal conducting metal electrode 12. Furthermore, the $WTe_2$ layer 50 becomes a superconductor in the vicinity of the second normal conducting metal electrodes 22 and 23 so that the Majorana particle is generated on the X1 side of the second normal conducting metal electrode 23, and the Majorana particle is generated between the second normal conducting metal electrode 21 and the second normal conducting metal electrode 22. Moreover, the $WTe_2$ layer 50 becomes a superconductor in the vicinity of the third normal conducting metal electrode 31 so that the Majorana particle is generated on the Y1 side of the third normal conducting metal electrode 31, and the Majorana particle is generated between the third normal conducting metal electrode 31 and the third normal conducting metal electrode 32.

Figure 5:
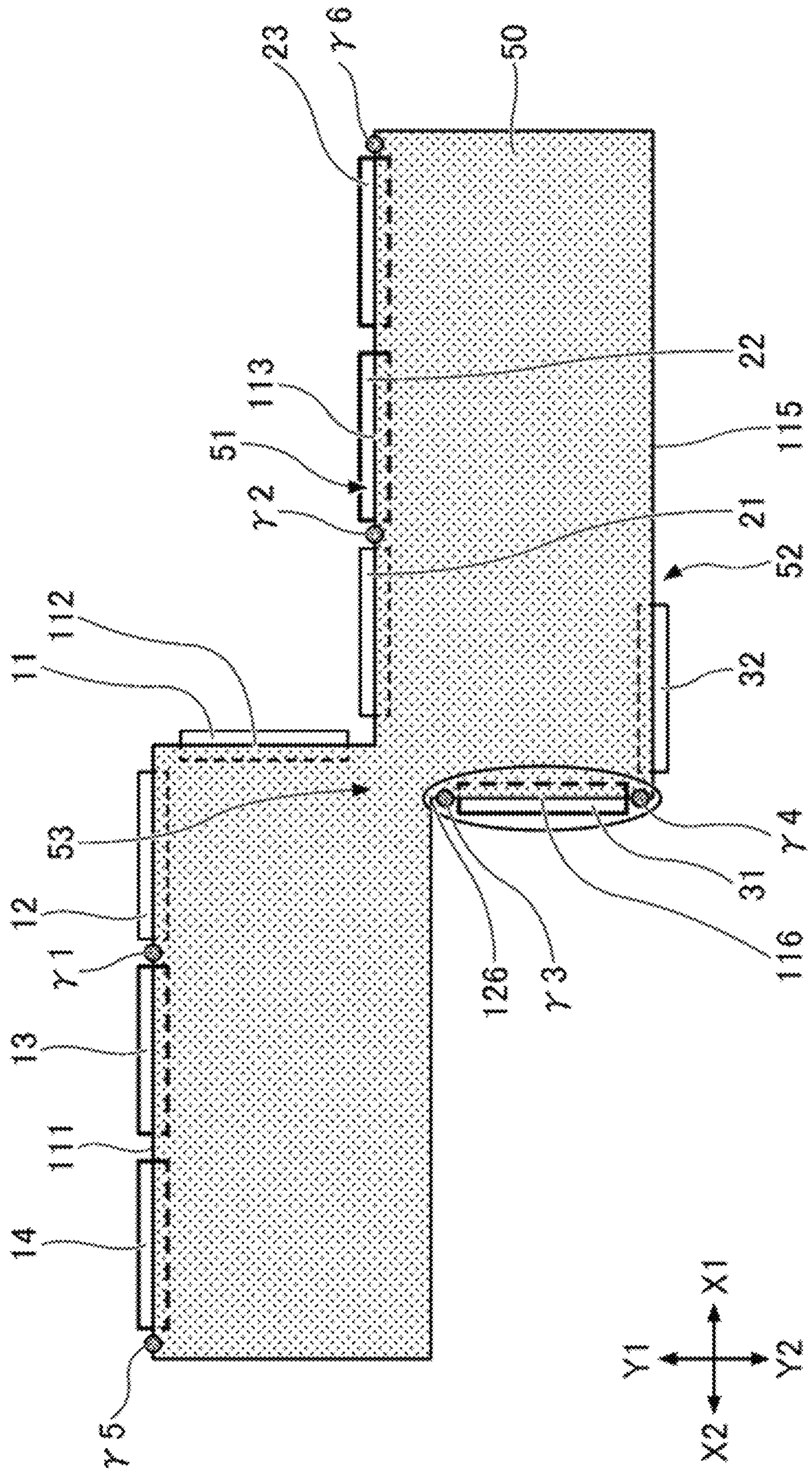
FIG. 5 is a schematic diagram (part 1) illustrating a change in a state of a Majorana particle.

Hereinafter, as illustrated in FIG. 5, the Majorana particle generated between the first normal conducting metal electrode 13 and the first normal conducting metal electrode 12 is denoted by γ1, the Majorana particle generated between the second normal conducting metal electrode 21 and the second normal conducting metal electrode 22 is denoted by γ2, the Majorana particle generated on the Y1 side of the third normal conducting metal electrode 31 is denoted by γ3, and the Majorana particle generated between the third normal conducting metal electrode 31 and the third normal conducting metal electrode 32 is denoted by γ4. In addition, the Majorana particle generated on the X2 side of the first normal conducting metal electrode 14 is denoted by γ5, and the Majorana particle generated on the X1 side of the second normal conducting metal electrode 23 is denoted by γ6.

Furthermore, as illustrated in FIG. 4, it is assumed that the superconducting phase difference between the first end 40A and the second end 40B is n rad in the initial state according to the second control unit.

In the initial state described above, the Majorana particle γ3 and the Majorana particle γ4 are coupled. Hereinafter, in this exemplary control method, the Majorana particle γ1 and the Majorana particle γ2 are moved clockwise not to cross each other, and positions thereof are exchanged.

Figure 6:
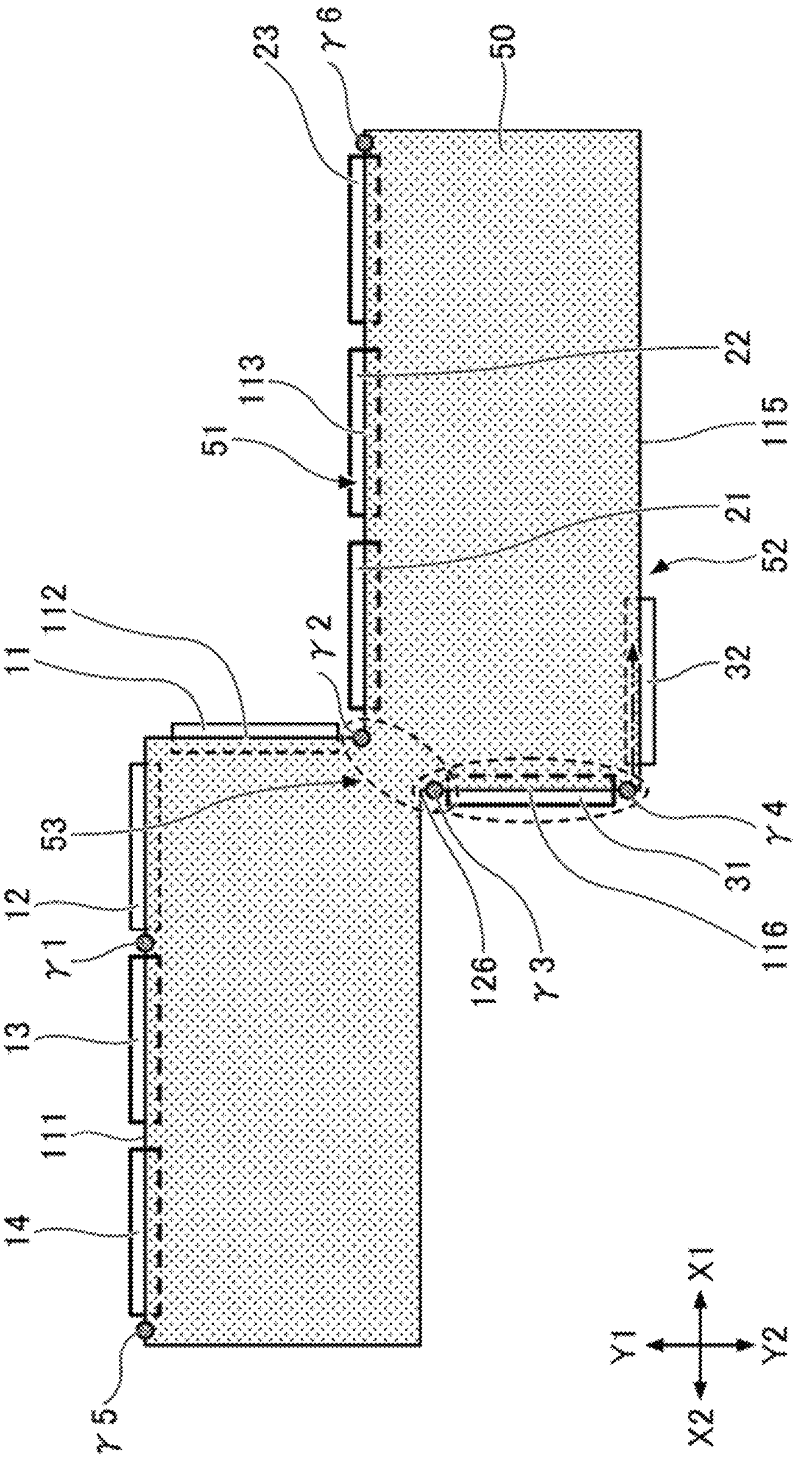
FIG. 6 is a schematic diagram (part 2) illustrating a change in the state of the Majorana particle.

As illustrated in FIG. 4, the voltage applied to the second normal conducting metal electrode 21 starts to be increased at time t0, and the second normal conducting metal electrode 21 enters the ON state at time t1. As a result, a range of the superconductor of the $WTe_2$ layer expands at the side 113, and the Majorana particle γ2 moves to the X2 side of the second normal conducting metal electrode 21 as illustrated in FIG. 6. Furthermore, the voltage applied to the third normal conducting metal electrode 32 starts to be increased at time t1. As a result, the range of the superconductor of the $WTe_2$ layer gradually expands at the side 115, the Majorana particle γ4 starts to move toward the X1 side along the second edge 52, and the coupling between the Majorana particle γ3 and the Majorana particle γ4 gradually weakens as illustrated in FIG. 6. Moreover, the superconducting phase difference starts to be decreased at time t1. As a result, as illustrated in FIG. 6, the coupling between the Majorana particle γ2 and the Majorana particle γ3 gradually strengthens.

Figure 7:
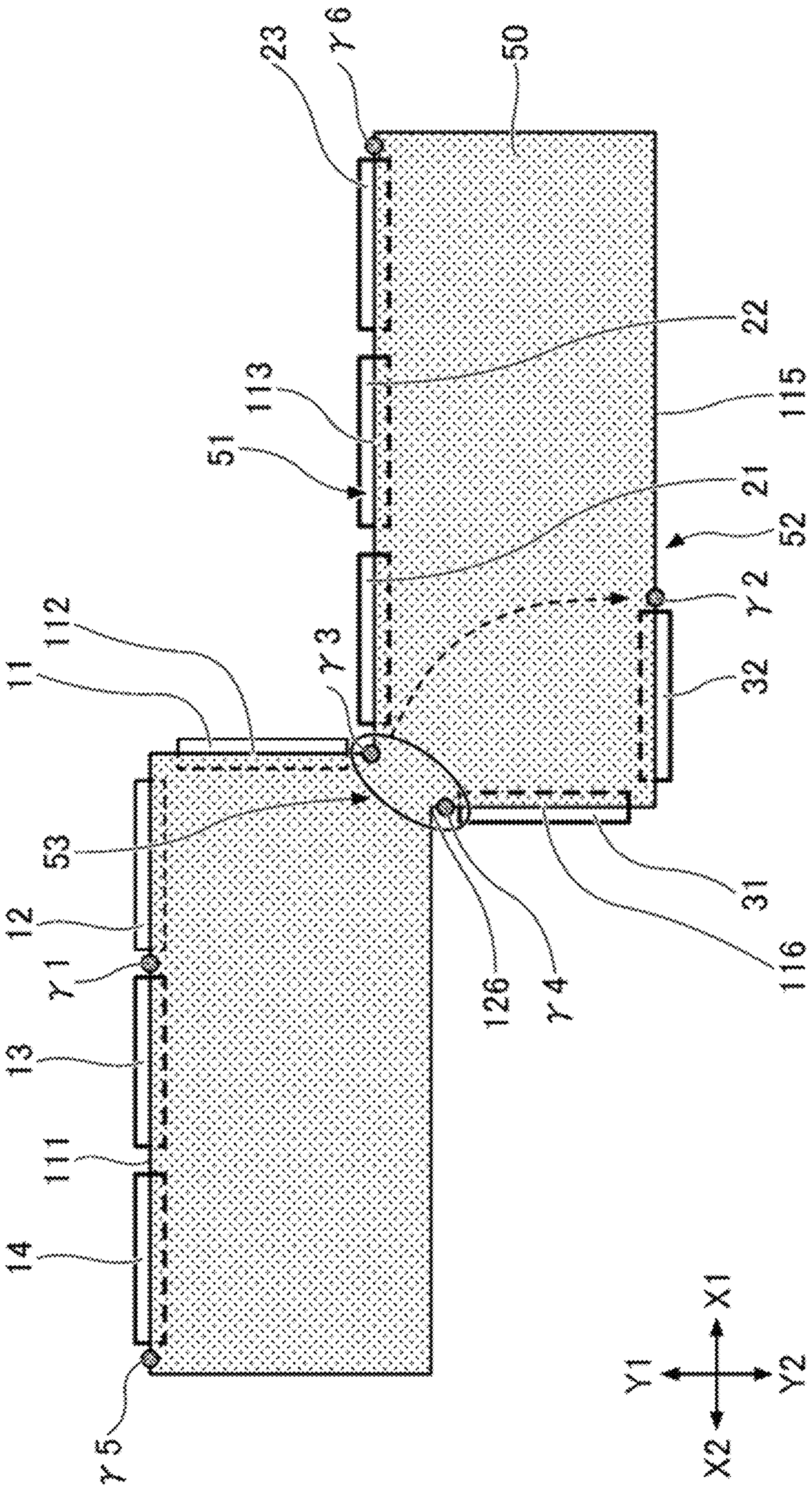
FIG. 7 is a schematic diagram (part 3) illustrating a change in the state of the Majorana particle.

Thereafter, as illustrated in FIG. 4, the third normal conducting metal electrode 32 enters the ON state, and the superconducting phase difference is set to 0 rad at time t2. As a result, as illustrated in FIG. 7, the Majorana particle γ2 moves to the X1 side of the third normal conducting metal electrode 32 by tunneling. Furthermore, the Majorana particle γ3 moves between the first normal conducting metal electrode 11 and the second normal conducting metal electrode 21 at the first edge 51 via the constricted portion 53, and the Majorana particle γ4 moves to the Y1 side of the third normal conducting metal electrode 31.

Thereafter, as illustrated in FIG. 4, the voltage applied to the first normal conducting metal electrode 12 starts to be increased at time t3. As a result, the range of the superconductor of the $WTe_2$ layer gradually expands at the side 111, and the Majorana particle γ1 starts to move toward the X1 side along the first edge 51.

Figure 8:
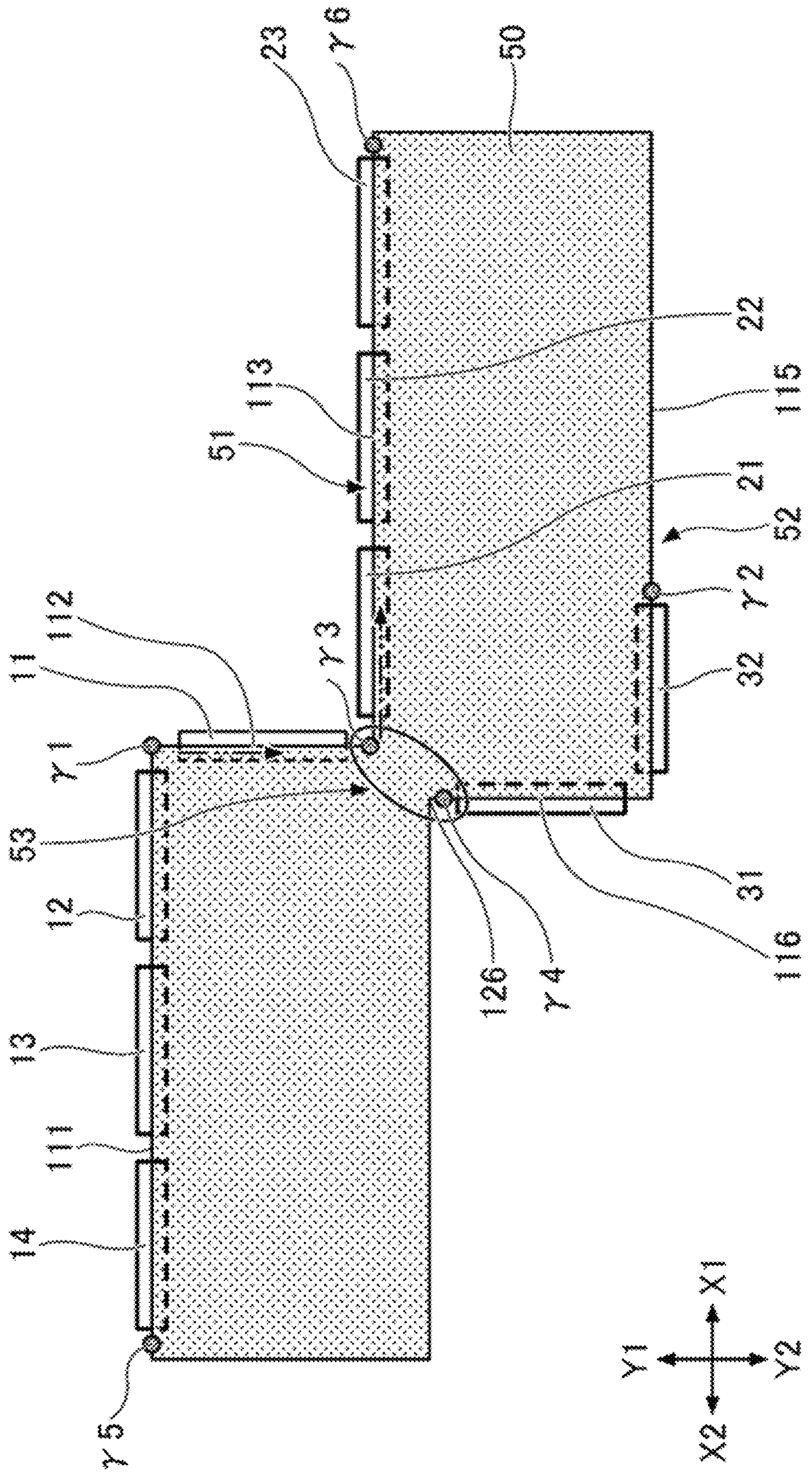
FIG. 8 is a schematic diagram (part 4) illustrating a change in the state of the Majorana particle.

Thereafter, as illustrated in FIG. 4, the first normal conducting metal electrode 12 enters the ON state at time t4. As a result, as illustrated in FIG. 8, the Majorana particle γ1 moves between the first normal conducting metal electrode 11 and the first normal conducting metal electrode 12. Furthermore, at time t4, the voltage applied to the first normal conducting metal electrode 11 starts to be increased, and the voltage applied to the second normal conducting metal electrode 21 starts to be decreased. As a result, the range of the superconductor of the $WTe_2$ layer gradually expands at the side 112 and the Majorana particle γ1 starts to move toward the Y2 side along the first edge 51 while the range of the superconductor of the $WTe_2$ layer gradually narrows at the side 113 and the Majorana particle γ3 starts to move toward the X1 side along the first edge 51.

Figure 9:
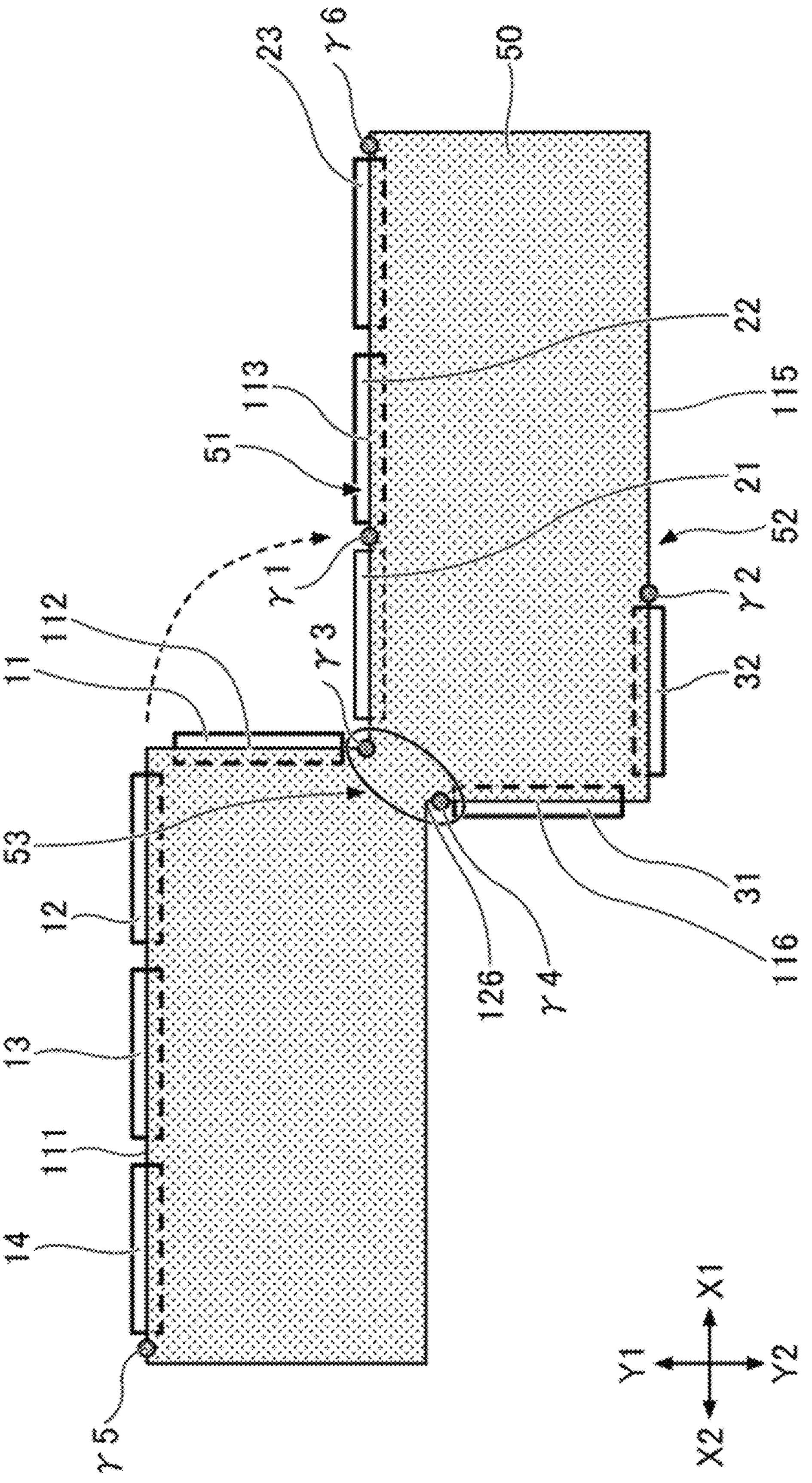
FIG. 9 is a schematic diagram (part 5) illustrating a change in the state of the Majorana particle.

Thereafter, as illustrated in FIG. 4, the first normal conducting metal electrode 11 enters the ON state, and the second normal conducting metal electrode 21 enters the OFF state at time t5. Since the Majorana particle γ3 is coupled to the Majorana particle γ4, the Majorana particle γ1 moves between the second normal conducting metal electrode 21 and the second normal conducting metal electrode 22 by tunneling as illustrated in FIG. 9.

Figure 10:
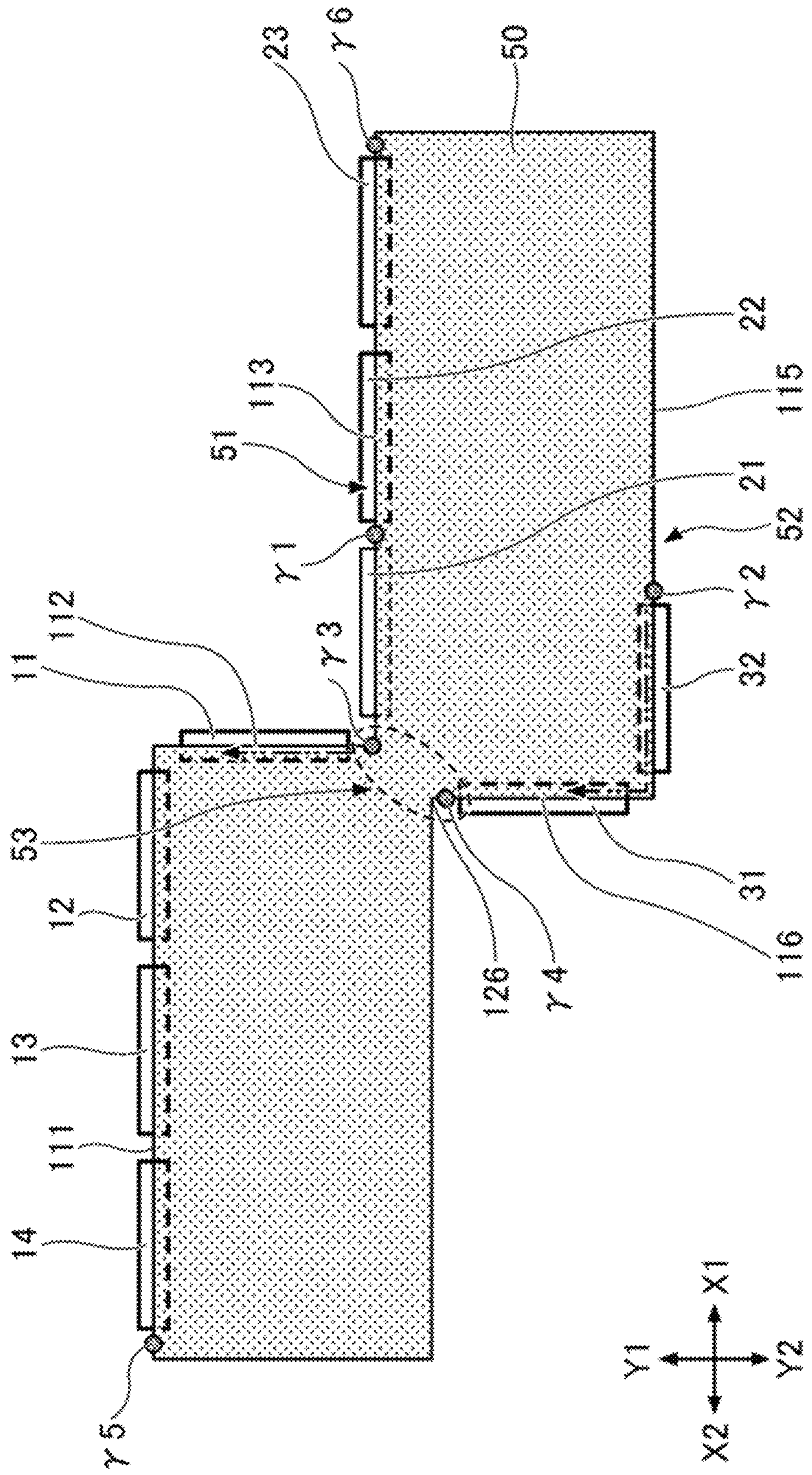
FIG. 10 is a schematic diagram (part 6) illustrating a change in the state of the Majorana particle.

Thereafter, as illustrated in FIG. 4, the voltage applied to the first normal conducting metal electrode 11 and the voltage applied to the third normal conducting metal electrode 32 start to be decreased at time t6. As a result, the range of the superconductor of the $WTe_2$ layer gradually narrows at the side 112 and the side 115, and as illustrated in FIG. 10, the Majorana particle γ3 starts to move toward the Y1 side along the first edge 51, and the Majorana particle γ2 starts to move toward the X2 side and the Y1 side along the second edge 52. Furthermore, the superconducting phase difference starts to be increased at time t6. As a result, as illustrated in FIG. 10, the coupling between the Majorana particle γ3 and the Majorana particle γ4 gradually weakens.

Figure 11:
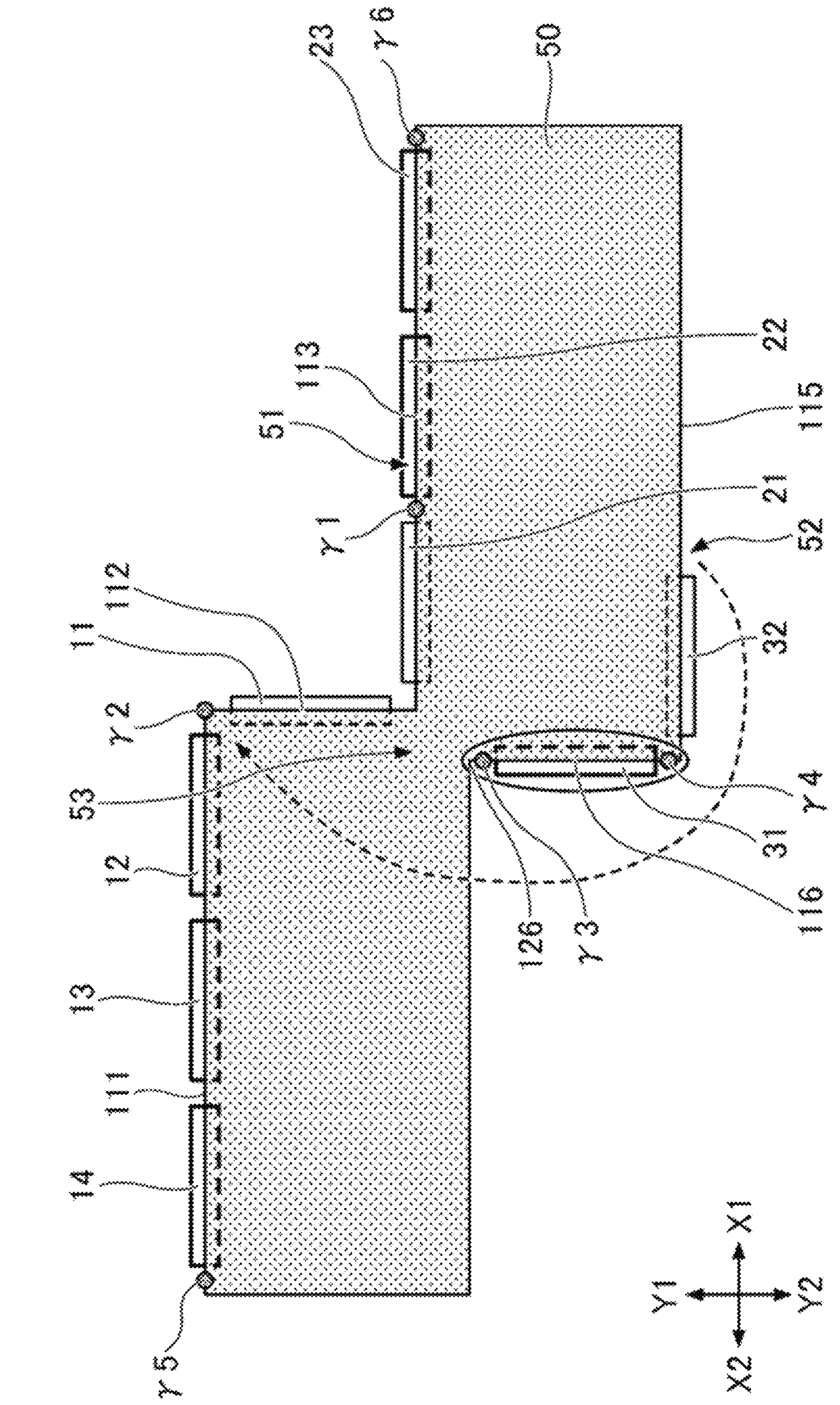
FIG. 11 is a schematic diagram (part 7) illustrating a change in the state of the Majorana particle.

Thereafter, as illustrated in FIG. 4, the first normal conducting metal electrode 11 and the third normal conducting metal electrode 32 enter the OFF state, and the superconducting phase difference is set to n rad at time t7. As a result, as illustrated in FIG. 11, the Majorana particle γ2 moves between the first normal conducting metal electrode 11 and the first normal conducting metal electrode 12 by tunneling. Furthermore, the Majorana particle γ4 moves toward the Y2 side of the third normal conducting metal electrode 31, and the Majorana particle γ3 moves toward the Y1 side of the third normal conducting metal electrode 31 of the second edge 52 via the constricted portion 53.

Figure 12:
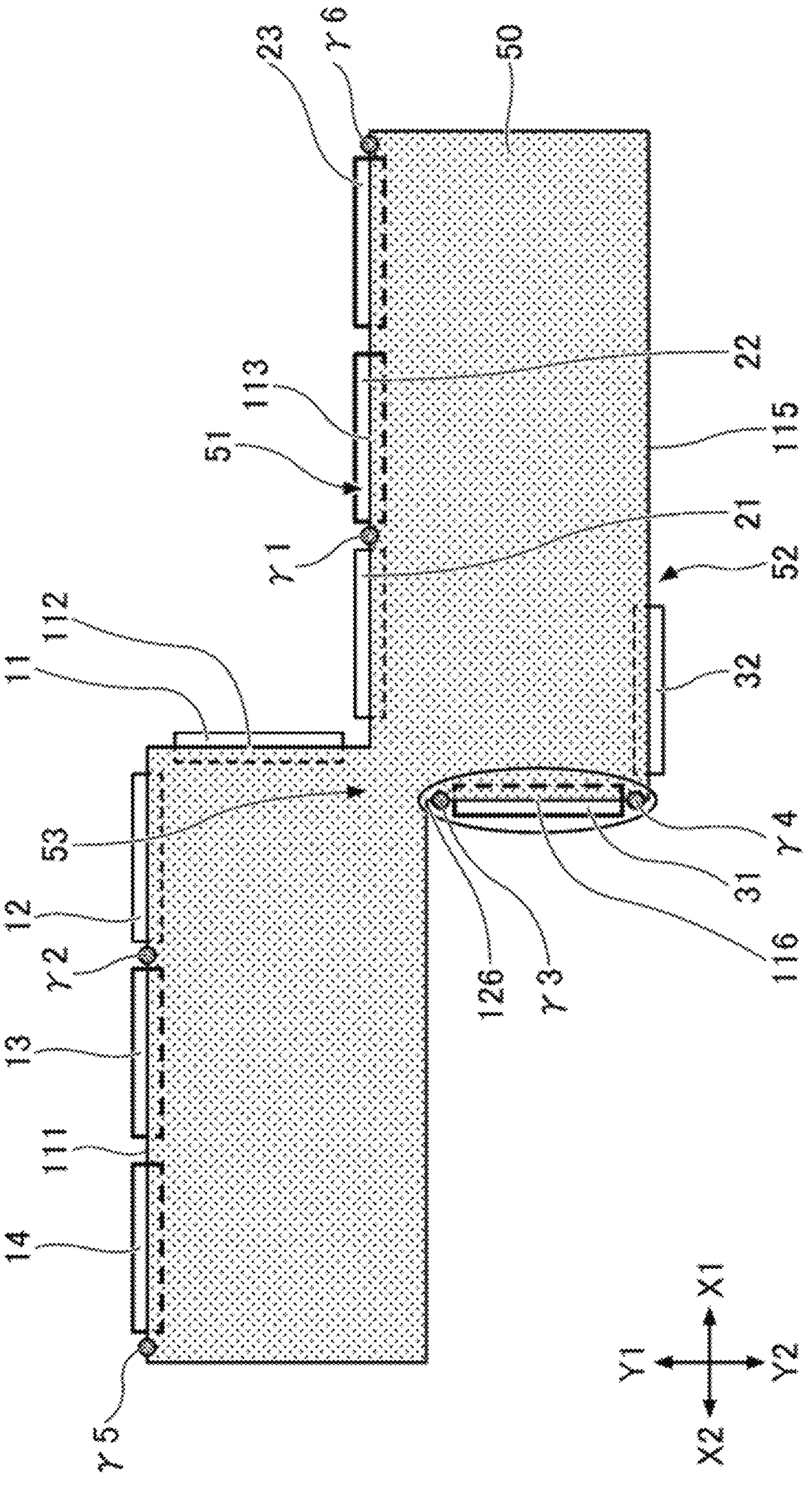
FIG. 12 is a schematic diagram (part 8) illustrating a change in the state of the Majorana particle.

Furthermore, the voltage applied to the first normal conducting metal electrode 12 starts to be decreased at time t7, and the first normal conducting metal electrode 12 enters the ON state at time t8. As a result, the range of the superconductor of the $WTe_2$ layer expands at the side 111, and the Majorana particle γ2 moves between the first normal conducting metal electrode 12 and the first normal conducting metal electrode 13 as illustrated in FIG. 12.

In this manner, the Majorana particle γ1 and the Majorana particle γ2 may be moved clockwise not to cross each other, and positions thereof may be exchanged.

As described above, according to the quantum device 1 according to the first embodiment, it becomes possible to control the position of the Majorana particle in the first edge 51 and the second edge 52 using the first control unit, and to control the tunneling of the Majorana particle between the first edge 51 and the second edge 52 using the second control unit. For example, it becomes possible to independently perform the control of the Majorana particle in the first edge 51 and the second edge 52 and the control of the tunneling of the Majorana particle between the first edge 51 and the second edge 52. Therefore, it becomes possible to obtain excellent controllability.

Furthermore, a mutual interaction between the Majorana particle above the first edge 51 and the Majorana particle above the second edge 52 may be caused by the superconducting phase difference between the first end 40A and the second end 40B of the superconducting metal loop 40. Thus, the distance between the first edge 51 and the second edge 52 in the constricted portion 53 does not need to be reduced to such an extent that coupling based on a quantum tunneling effect occurs. The distance between the vertex 122 and the vertex 126 may be equal to or more than 50 nm, for example. Therefore, the $WTe_2$ layer including the constricted portion 53 may be easily formed, and the quantum device 1 may be stably manufactured.

Next, a method for manufacturing the quantum device 1 according to the first embodiment will be described. FIGS. 13 to 18 are top views illustrating the method for manufacturing the quantum device 1 according to the first embodiment. FIGS. 19 to 24 are cross-sectional views illustrating the method for manufacturing the quantum device 1 according to the first embodiment.

Figure 13:
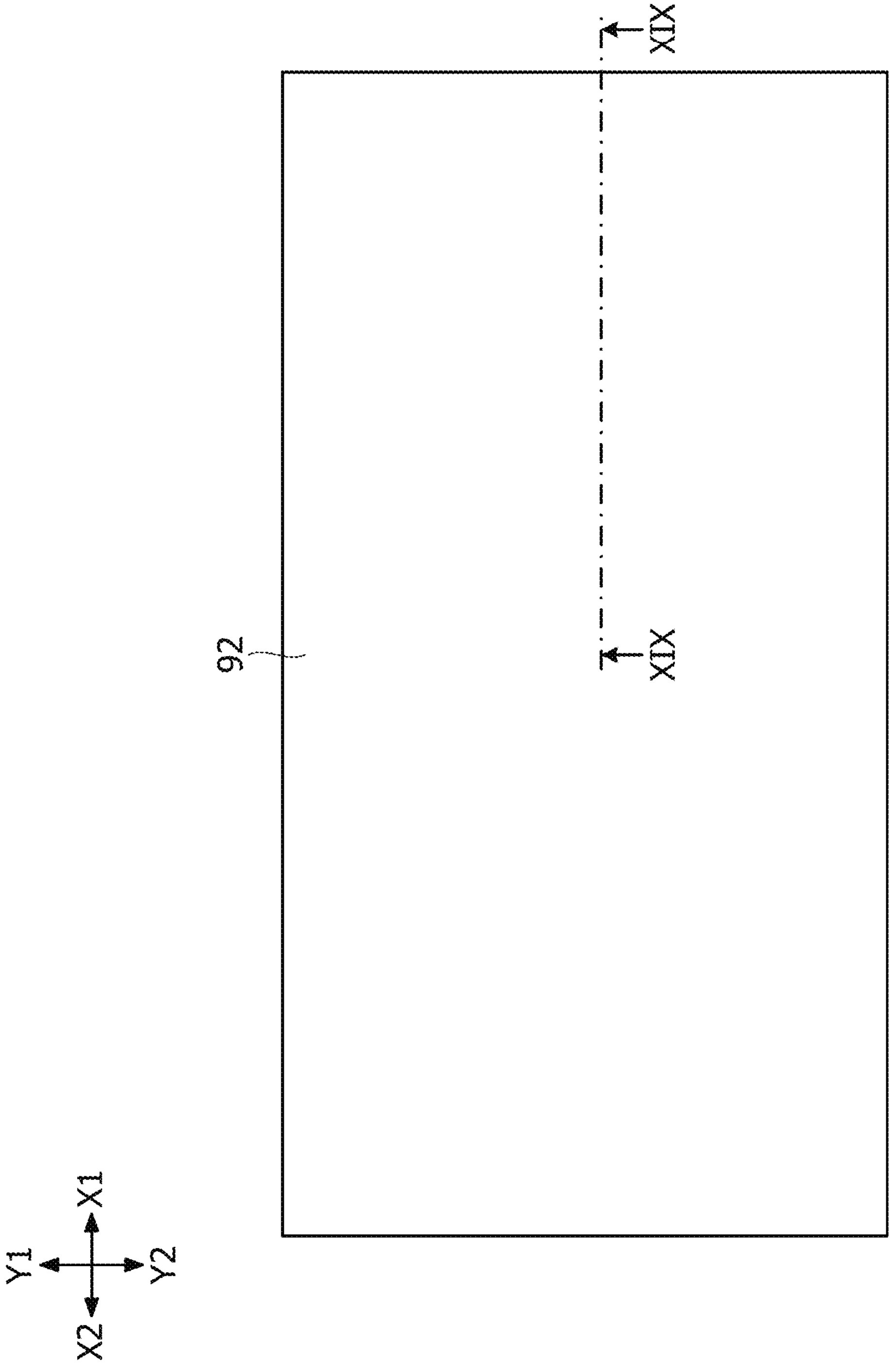
FIG. 13 is a top view (part 1) illustrating a method for manufacturing the quantum device according to the first embodiment.
Figure 19:
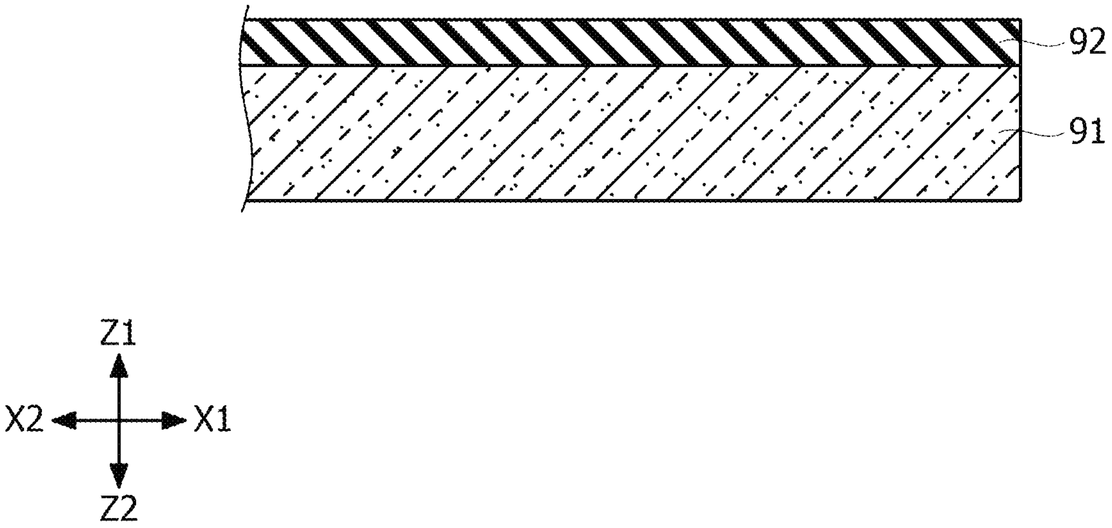
FIG. 19 is a cross-sectional view (part 1) illustrating the method for manufacturing the quantum device according to the first embodiment.

First, as illustrated in FIGS. 13 and 19, the substrate 91 having the insulating layer 92 formed over its upper surface is prepared. For example, the substrate 91 is a Si substrate, and the insulating layer 92 is a $SiO_2$ layer. A laminated body of the substrate 91 and the insulating layer 92 may be a substrate with an oxide layer. FIG. 19 corresponds to a cross-sectional view taken along line XIX-XIX line in FIG. 13.

Figure 14:
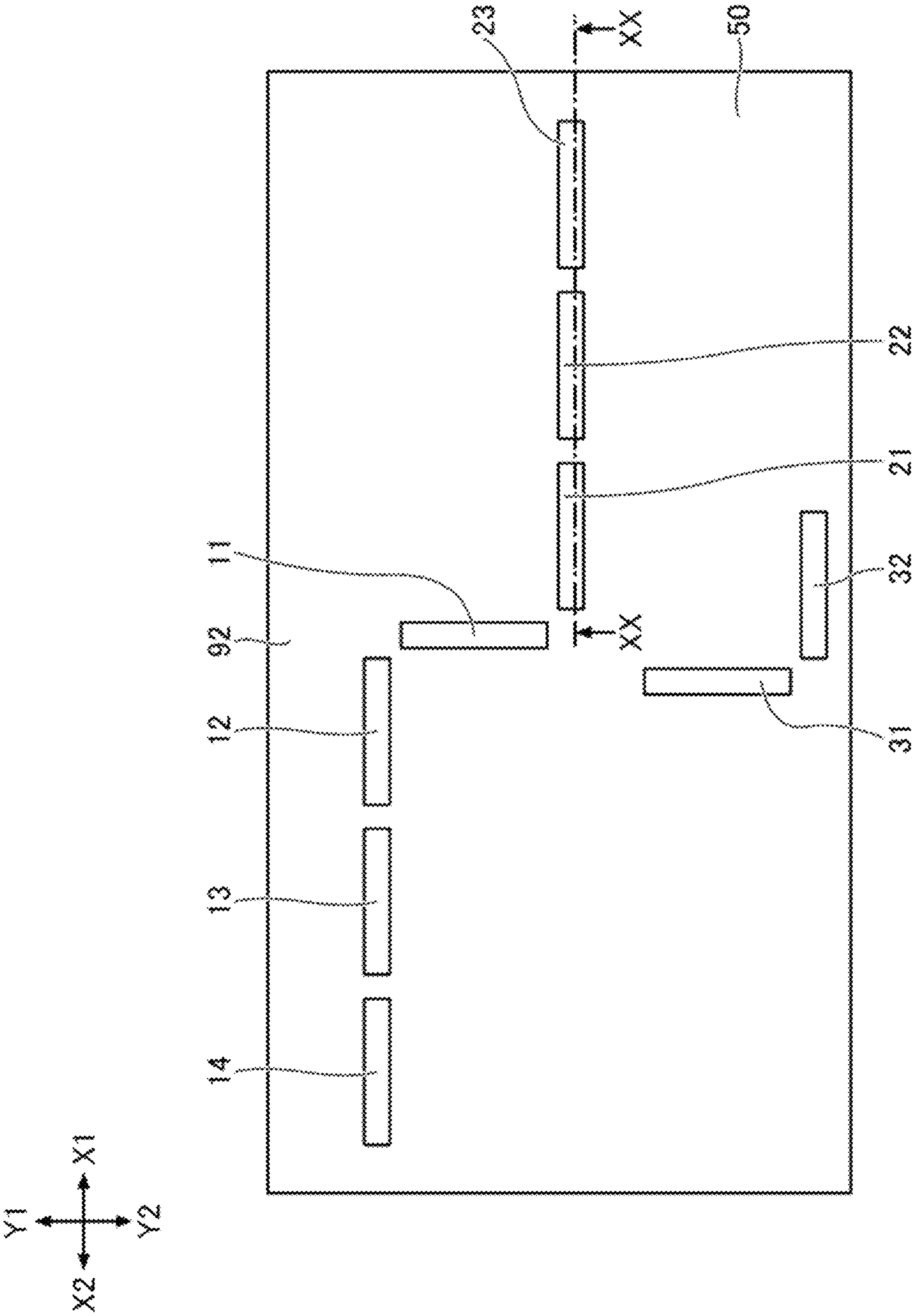
FIG. 14 is a top view (part 2) illustrating the method for manufacturing the quantum device according to the first embodiment.
Figure 20:
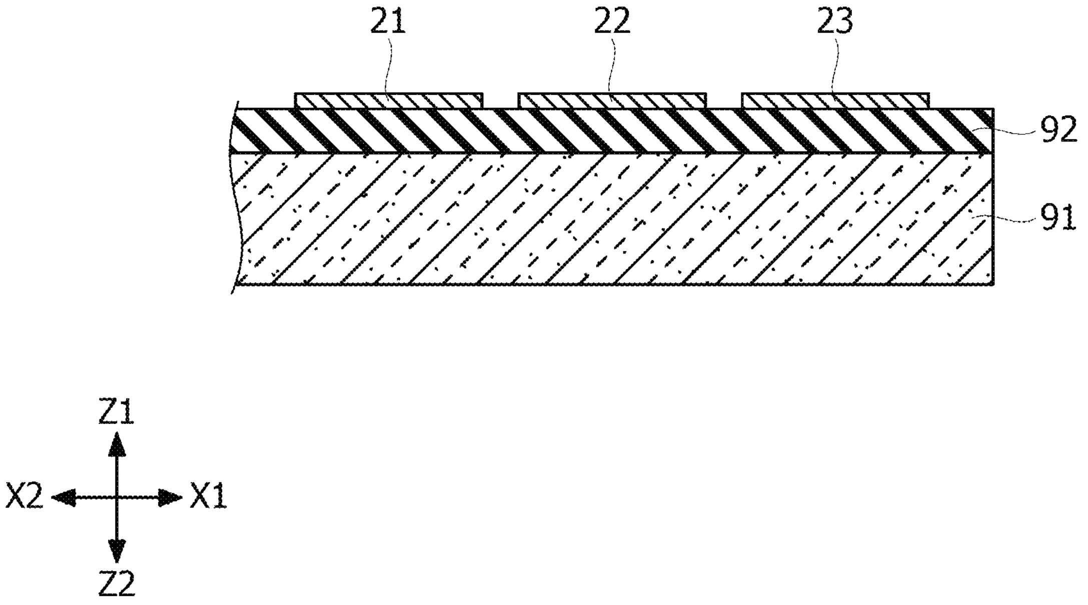
FIG. 20 is a cross-sectional view (part 2) illustrating the method for manufacturing the quantum device according to the first embodiment.

Next, as illustrated in FIGS. 14 and 20, the first normal conducting metal electrodes 11 to 14, the second normal conducting metal electrodes 21 to 23, and the third normal conducting metal electrodes 31 and 32 are formed above the insulating layer 92. The first normal conducting metal electrodes 11 to 14, the second normal conducting metal electrodes 21 to 23, and the third normal conducting metal electrodes 31 and 32 are, for example, Au electrodes or Pd electrodes. The first normal conducting metal electrodes 11 to 14, the second normal conducting metal electrodes 21 to 23, and the third normal conducting metal electrodes 31 and 32 may be formed by, for example, a vapor deposition method and a lift-off method. In order to improve adhesion, a Ti film having a thickness of several nm may be formed between the insulating layer 92 and the first normal conducting metal electrodes 11 to 14, the second normal conducting metal electrodes 21 to 23, and the third normal conducting metal electrodes 31 and 32. FIG. 20 corresponds to a cross-sectional view taken along line XX-XX in FIG. 14.

Figure 15:
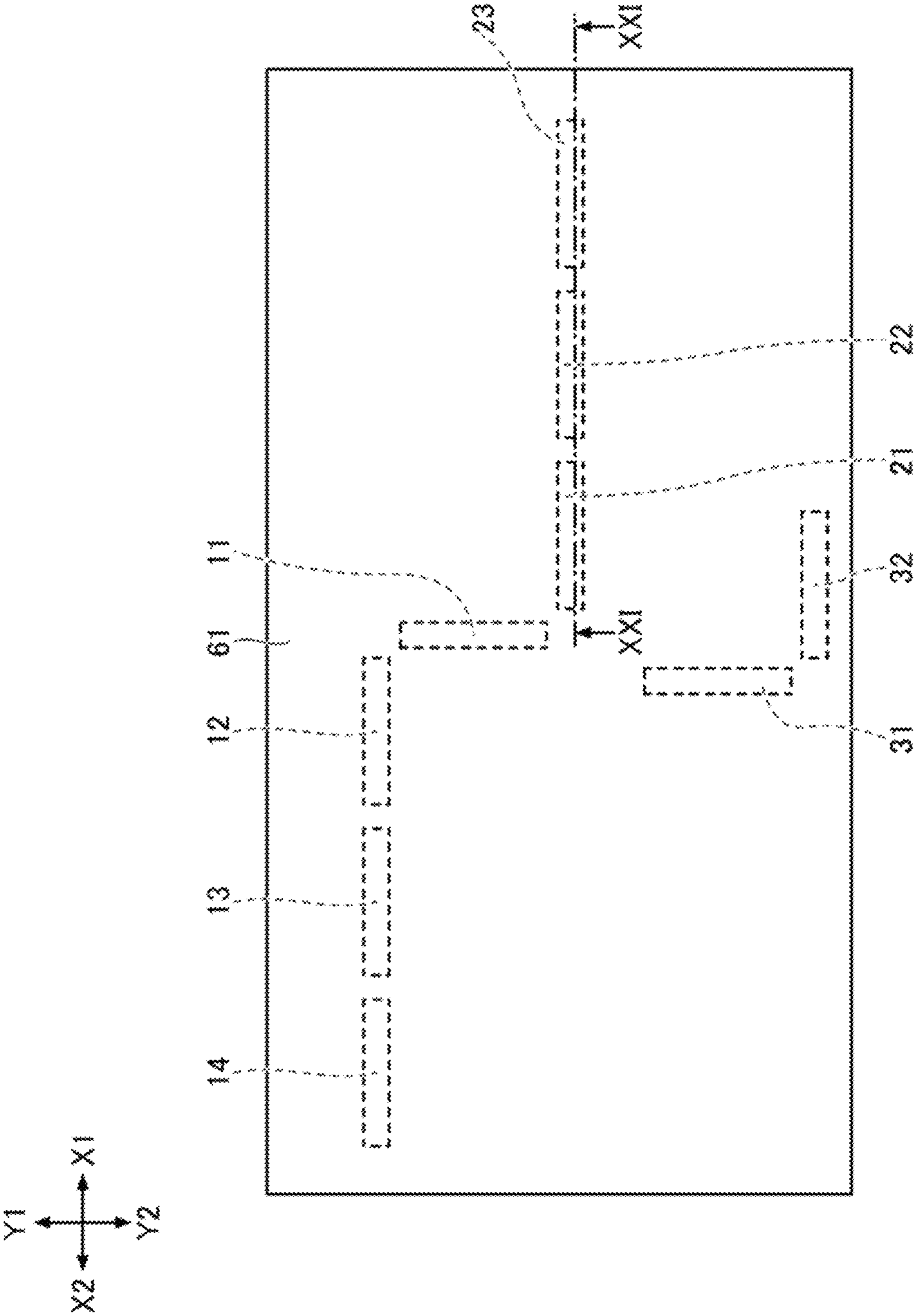
FIG. 15 is a top view (part 3) illustrating the method for manufacturing the quantum device according to the first embodiment.
Figure 21:
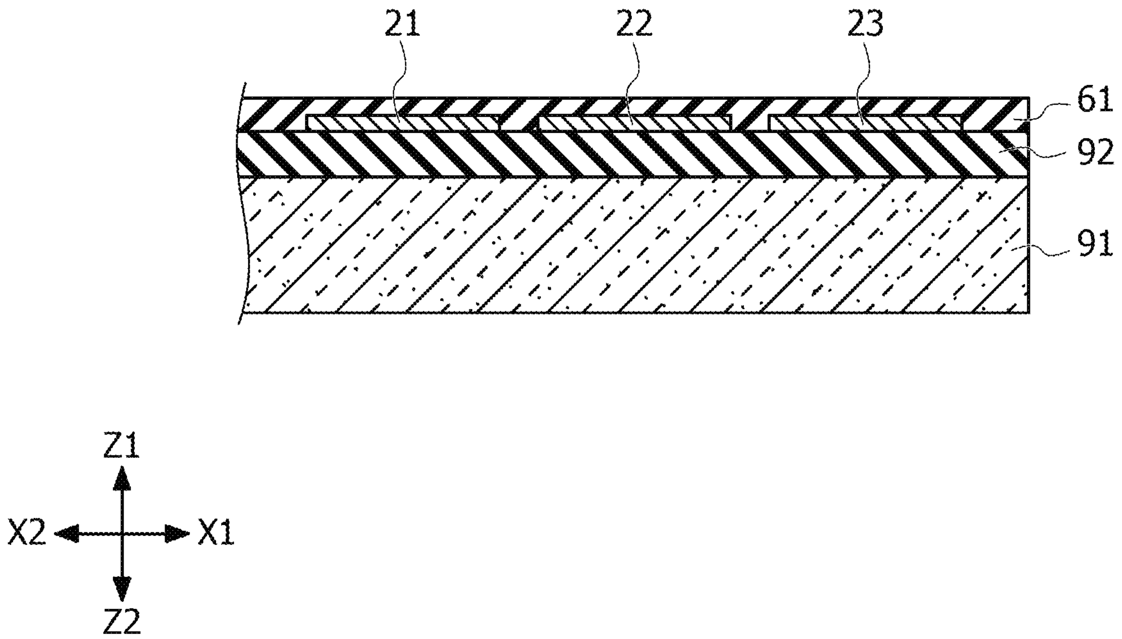
FIG. 21 is a cross-sectional view (part 3) illustrating the method for manufacturing the quantum device according to the first embodiment.

Thereafter, as illustrated in FIGS. 15 and 21, the insulating layer 61 is provided over the insulating layer 92 to cover the first normal conducting metal electrodes 11 to 14, the second normal conducting metal electrodes 21 to 23, and the third normal conducting metal electrodes 31 and 32. The insulating layer 61 is, for example, an h-BN layer. FIG. 21 corresponds to a cross-sectional view taken along line XXI-XXI in FIG. 15.

Figure 16:
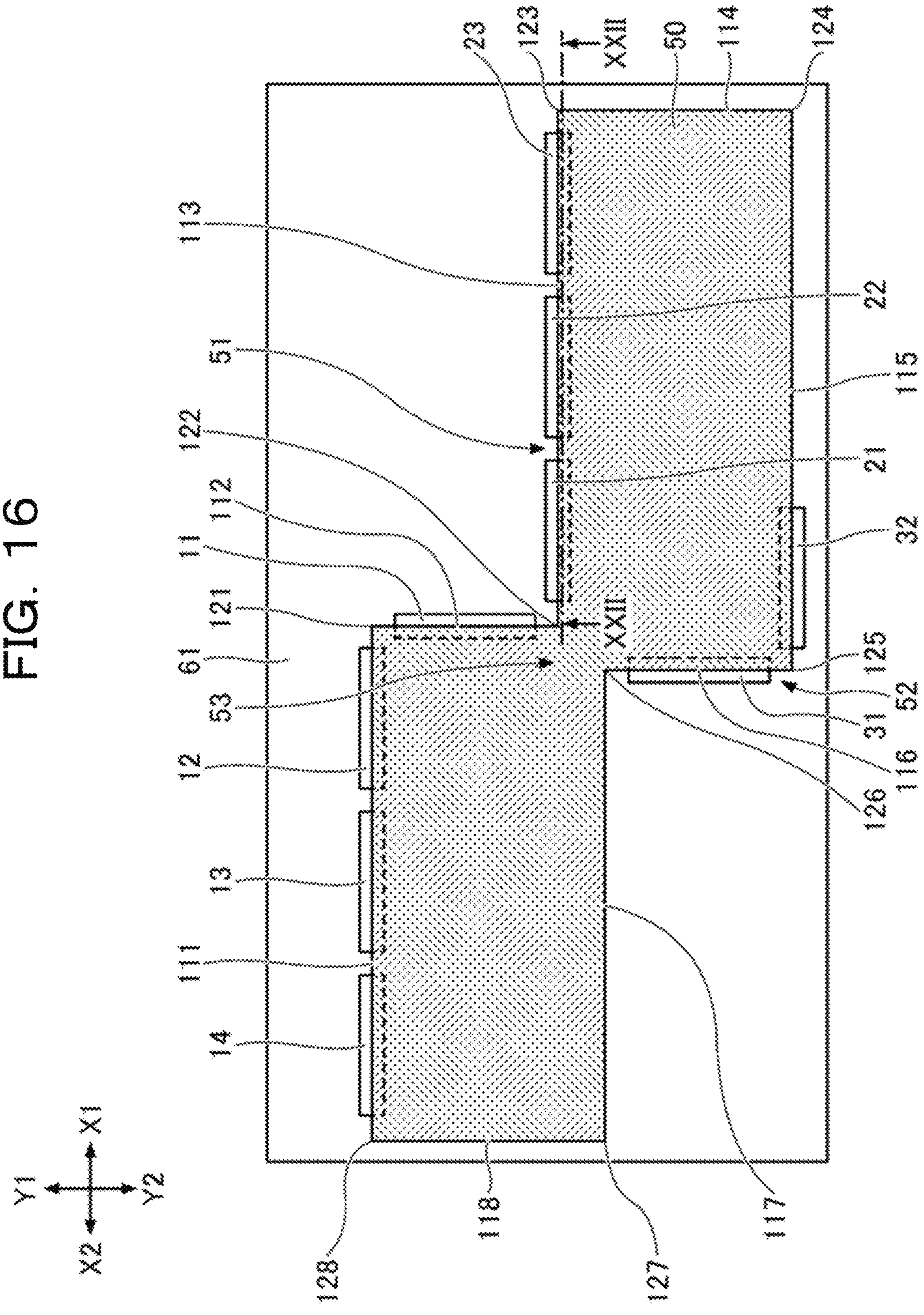
FIG. 16 is a top view (part 4) illustrating the method for manufacturing the quantum device according to the first embodiment.
Figure 22:
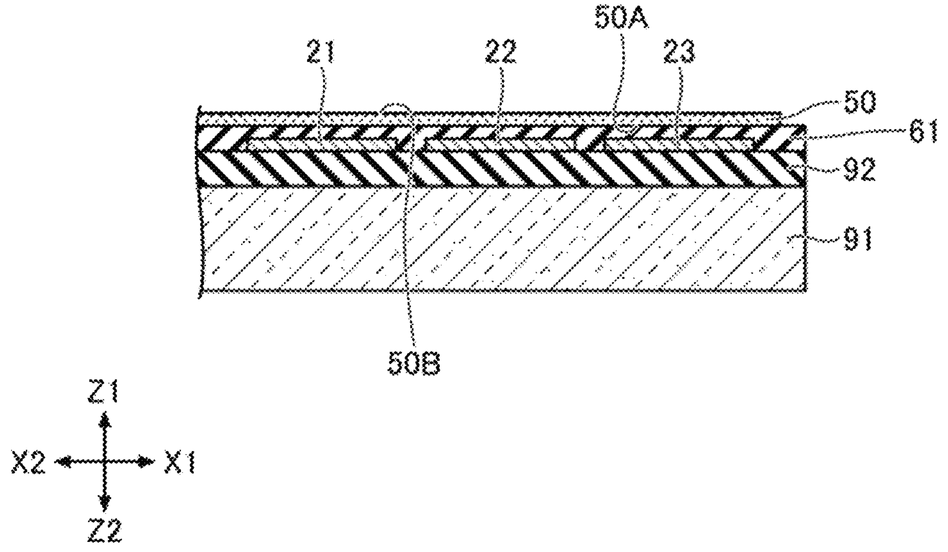
FIG. 22 is a cross-sectional view (part 4) illustrating the method for manufacturing the quantum device according to the first embodiment.

Subsequently, a $WTe_2$ layer is provided over the insulating layer 61. Next, as illustrated in FIGS. 16 and 22, the $WTe_2$ layer is processed by lithography to form the $WTe_2$ layer including the first edge 51, the second edge 52, and the constricted portion 53. FIG. 22 corresponds to a cross-sectional view taken along line XXII-XXII in FIG. 16.

Figure 17:
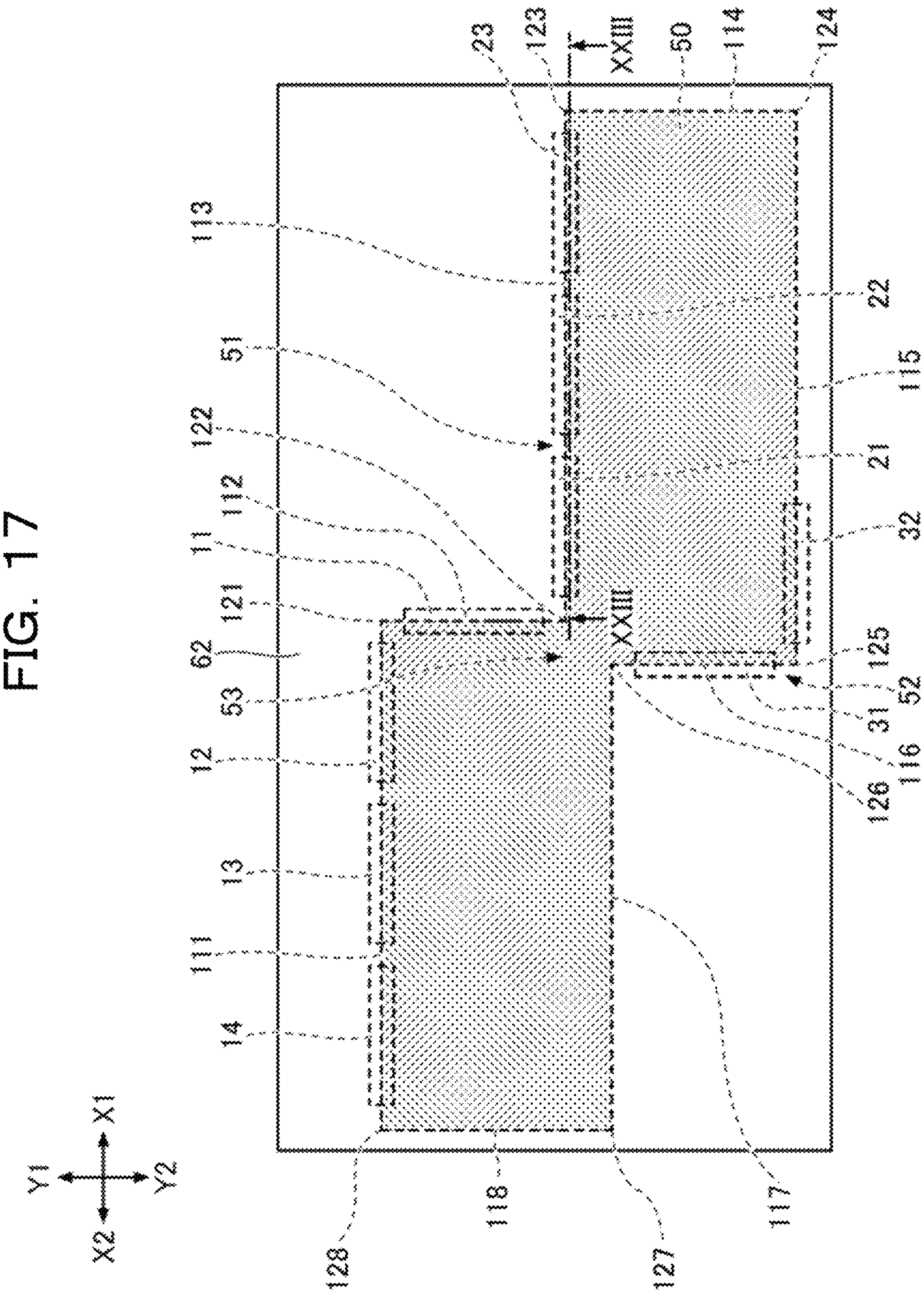
FIG. 17 is a top view (part 5) illustrating the method for manufacturing the quantum device according to the first embodiment.
Figure 23:
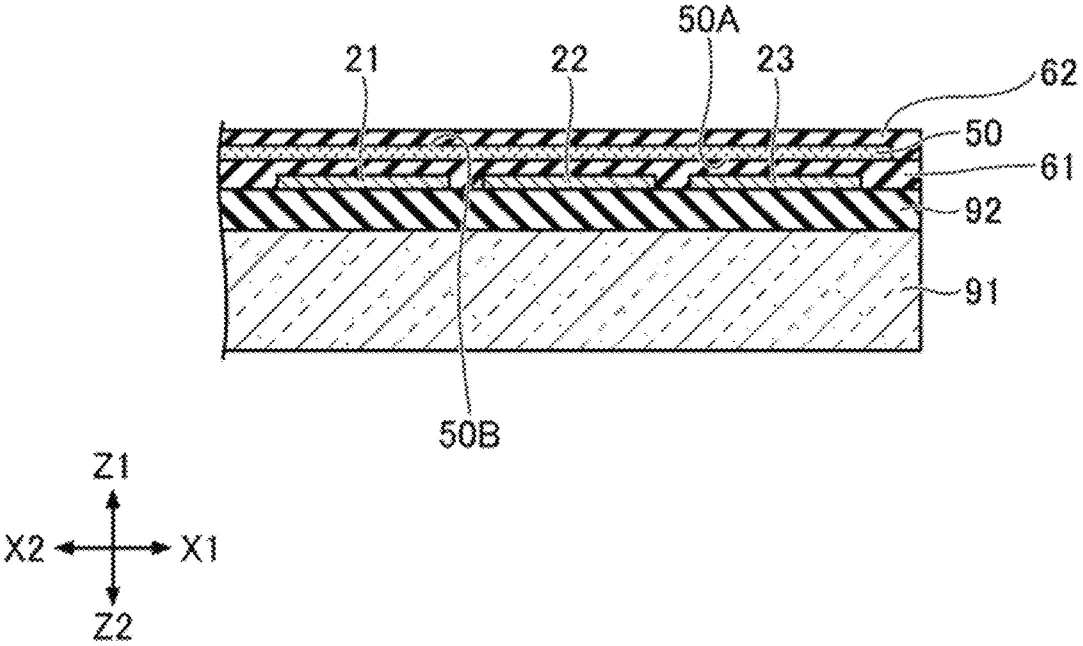
FIG. 23 is a cross-sectional view (part 5) illustrating the method for manufacturing the quantum device according to the first embodiment.

Thereafter, as illustrated in FIGS. 17 and 23, the insulating layer 62 is provided over the insulating layer 92 to cover the $WTe_2$ layer 50. The insulating layer 62 is, for example, an h-BN layer. FIG. 23 corresponds to a cross-sectional view taken along line XXIII-XXIII in FIG. 17.

Figure 18:
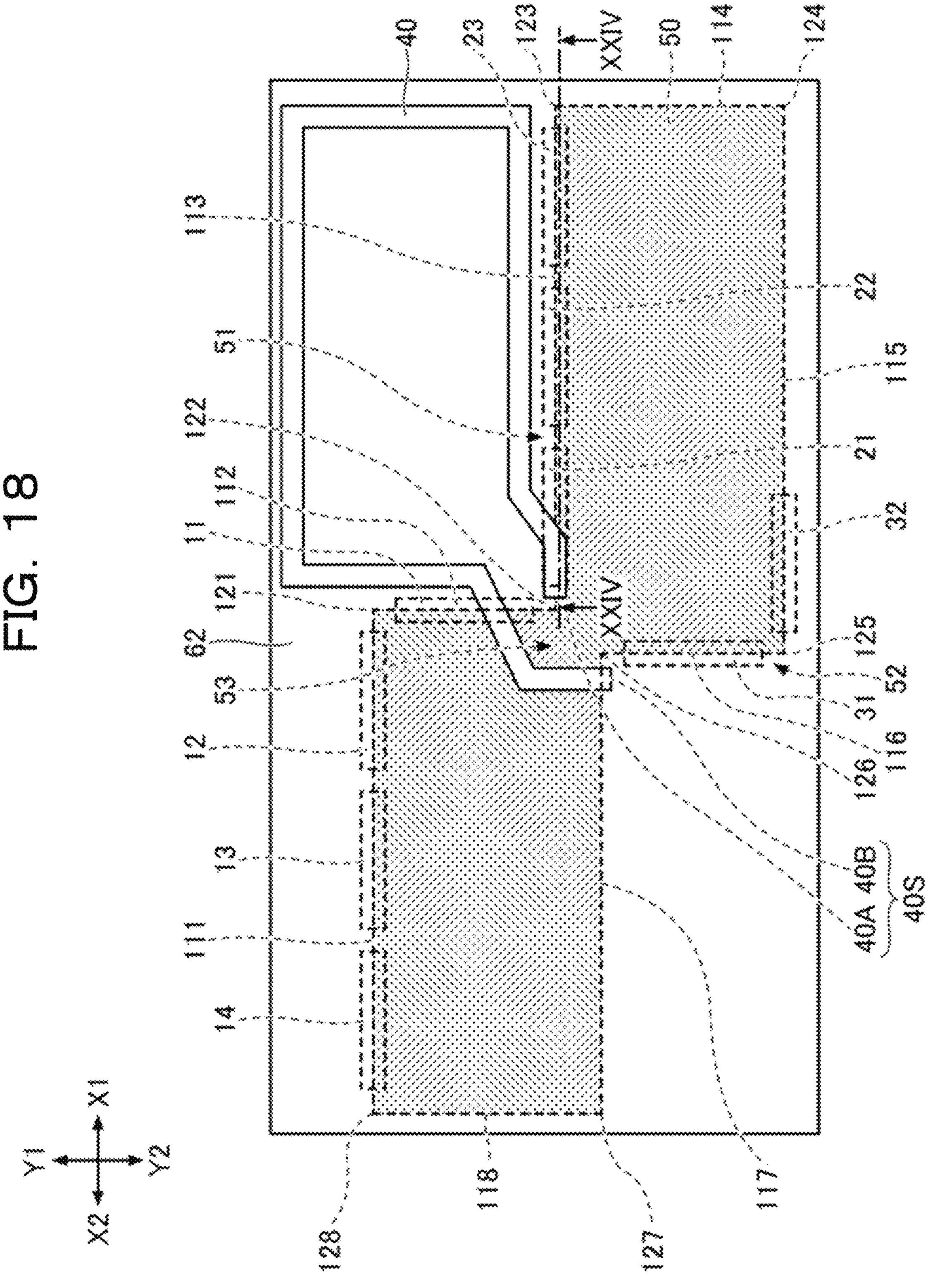
FIG. 18 is a top view (part 6) illustrating the method for manufacturing the quantum device according to the first embodiment.
Figure 24:
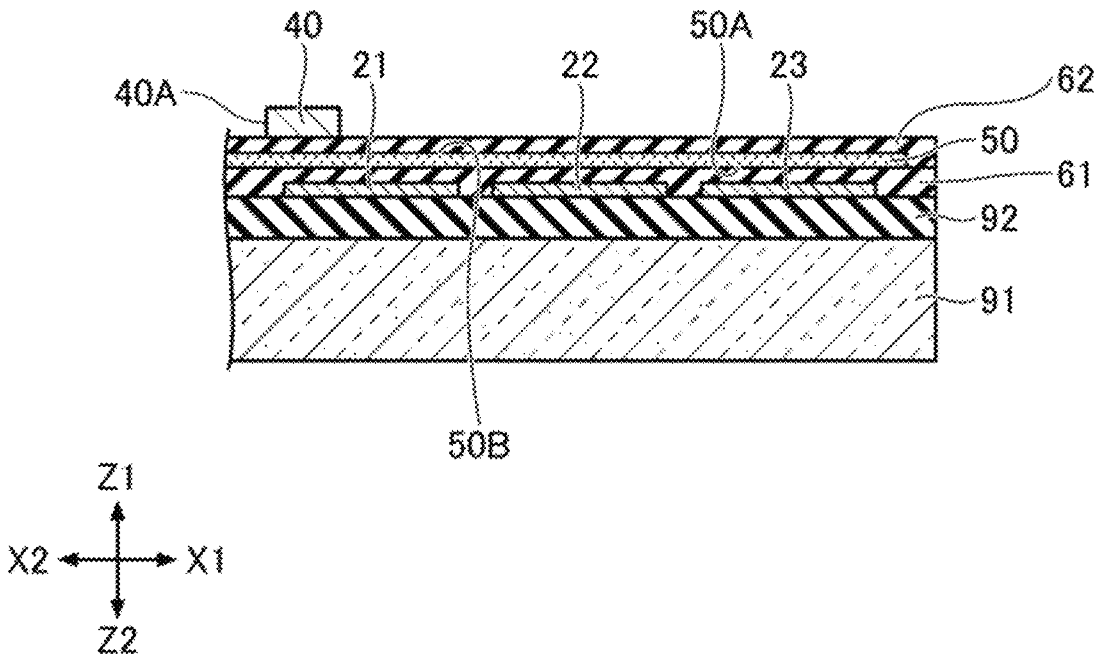
FIG. 24 is a cross-sectional view (part 6) illustrating the method for manufacturing the quantum device according to the first embodiment.

After the insulating layer 62 is provided, the superconducting metal loop 40 is formed above the insulating layer 92 as illustrated in FIGS. 18 and 24. A material of the superconducting metal loop 40 is, for example, Al or Nb. The superconducting metal loop 40 may be formed by, for example, a vapor deposition method and a lift-off method.

Thereafter, although illustration is omitted, the first control unit and the second control unit are provided.

The quantum device 1 according to the first embodiment may be manufactured in this manner.

Note that the insulating layer 92 may be a laminated body of a first h-BN layer and a second h-BN layer. In this case, after the $WTe_2$ layer is provided, the first h-BN layer may be laminated without processing the $WTe_2$ layer, the first h-BN layer and the $WTe_2$ layer may be processed to form the $WTe_2$ layer 50 thereafter, and the second h-BN layer may be laminated to cover the $WTe_2$ layer 50 and the first h-BN layer thereafter. In this case, oxidation of the $WTe_2$ layer 50 may be easily suppressed.

Furthermore, it is preferable that the distance between the superconducting metal loop 40 and the $WTe_2$ layer 50 is smaller to control the superconducting phase difference in the constricted portion 53 using the superconducting metal loop 40. Thus, it is preferable that, before the formation of the superconducting metal loop 40, the portion of the insulating layer 62 where the superconducting metal loop 40 is to be formed is made into a thinner film to have a thickness of, for example, approximately 1 nm to 3 nm by dry etching or the like.

Second Embodiment

Figure 25:
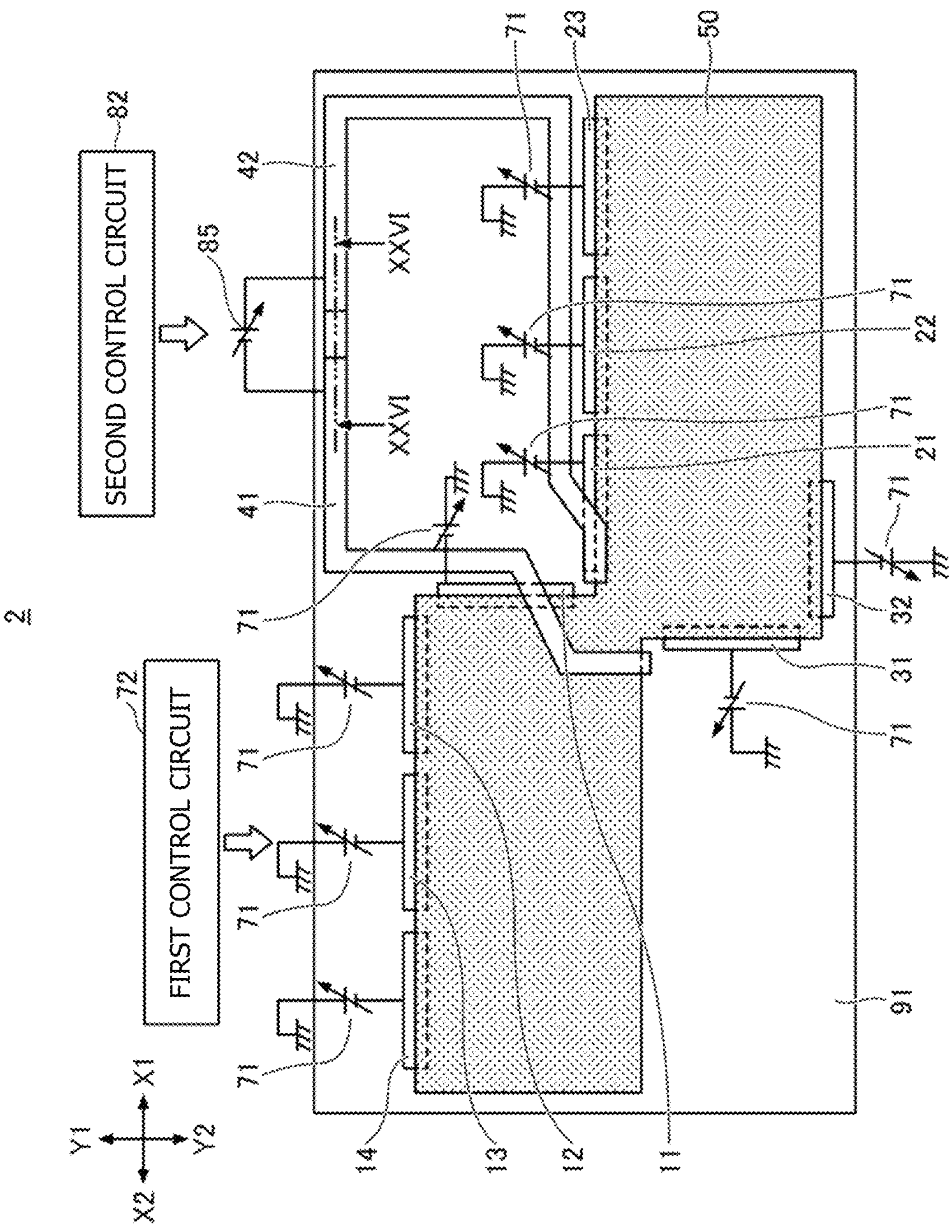
FIG. 25 is a schematic diagram illustrating a quantum device according to a second embodiment.
Figure 26:
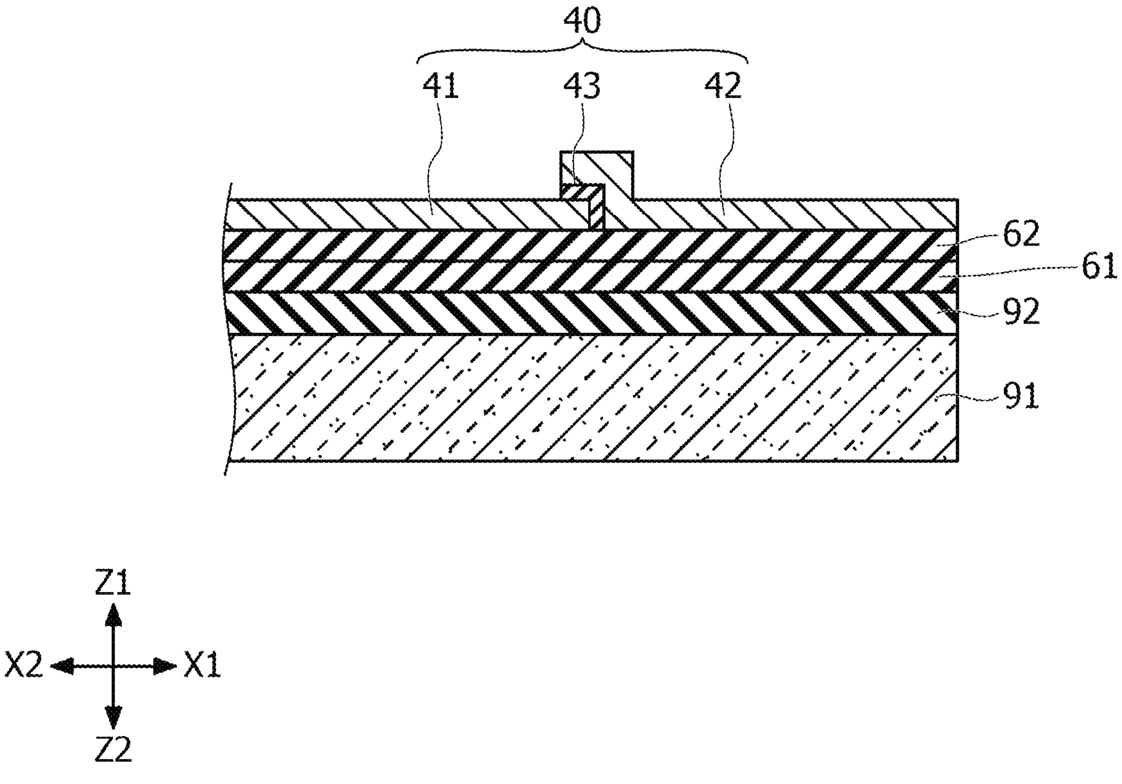
FIG. 26 is a cross-sectional view illustrating the quantum device according to the second embodiment.

Next, a second embodiment will be described. The second embodiment is different from the first embodiment mainly in a configuration of a second control unit. FIG. 25 is a schematic diagram illustrating a quantum device according to the second embodiment. FIG. 26 is a cross-sectional view illustrating a part of the quantum device according to the second embodiment. FIG. 26 corresponds to a cross-sectional view taken along line XXVI-XXVI in FIG. 25. In FIG. 25, an insulating layer is omitted for convenience.

As illustrated in FIGS. 25 and 26, in a quantum device 2 according to the second embodiment, a superconducting metal loop 40 includes a first loop portion 41 including a first end 40A, a second loop portion 42 including a second end 40B, and an aluminum oxide film 43 sandwiched between the first loop portion 41 and the second loop portion 42. The first loop portion 41 and the second loop portion 42 are subject to Josephson junction with each other via the aluminum oxide film 43. The second control unit further includes a DC power supply 85 coupled between the first loop portion 41 and the second loop portion 42. A second control circuit 82 controls the DC power supply 85.

Other components are similar to those of the first embodiment.

According to the quantum device 2, the second control unit may control a superconducting phase difference between the first end 40A and the second end 40B of the superconducting metal loop 40 by changing a potential difference between the first loop portion 41 and the second loop portion 42.

Third Embodiment

Figure 27:
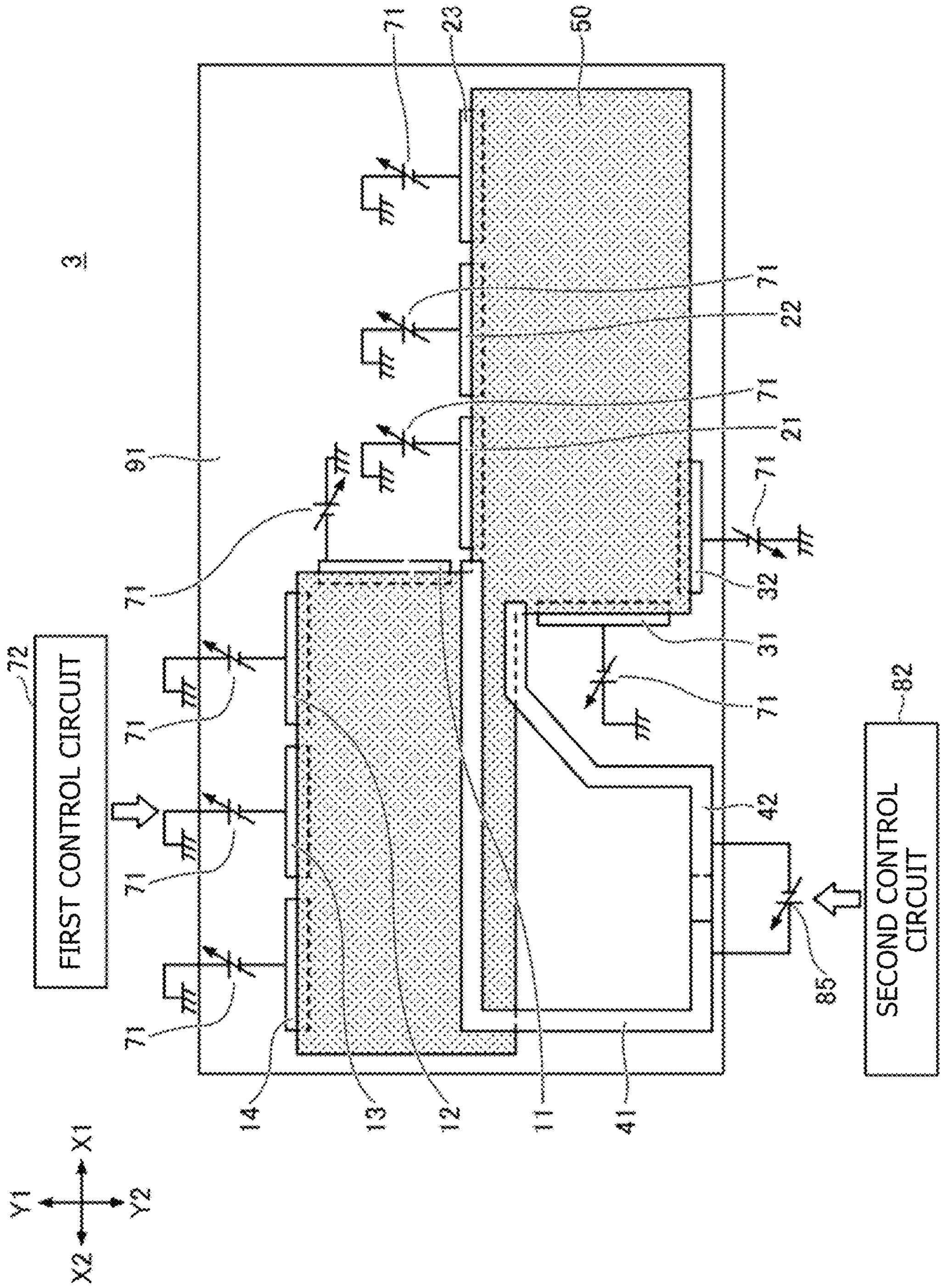
FIG. 27 is a schematic diagram illustrating a quantum device according to a third embodiment.

Next, a third embodiment will be described. The third embodiment is different from the second embodiment mainly in arrangement of the superconducting metal loop 40. FIG. 27 is a schematic diagram illustrating a quantum device according to the third embodiment. In FIG. 27, an insulating layer is omitted for convenience.

As illustrated in FIG. 27, in a quantum device 3 according to the third embodiment, the superconducting metal loop 40 is disposed not to overlap any of first normal conducting metal electrodes 11 to 14, second normal conducting metal electrodes 21 to 23, and third normal conducting metal electrodes 31 and 32 in planar view.

Other components are similar to those of the second embodiment.

According to the third embodiment, an unintended mutual interaction is made difficult to occur between the superconducting metal loop 40 and the first normal conducting metal electrodes 11 to 14, the second normal conducting metal electrodes 21 to 23, and the third normal conducting metal electrodes 31 and 32.

Furthermore, according to the third embodiment, an insulating layer 62 is easily thinned as a whole. Thus, it becomes possible to easily control a superconducting phase difference in a constricted portion 53 using the superconducting metal loop 40 without performing the processing of making the insulating layer 62 into a thinner film as described above.

Note that the arrangement of the superconducting metal loop 40 according to the third embodiment may be applied to the first embodiment.

While the number of the first normal conducting metal electrodes, the number of the second normal conducting metal electrodes, and the number of the third normal conducting metal electrodes are not limited, they are each preferably two or more. A larger number of the first normal conducting metal electrodes, second normal conducting metal electrodes, and third normal conducting metal electrodes may be provided. Furthermore, the planar shape of the $WTe_2$ layer is not limited to a shape in which two rectangles partially overlap. Furthermore, the superconducting metal loop may be positioned closer to the substrate side than the $WTe_2$ layer, and the first normal conducting metal electrodes, the second normal conducting metal electrodes, and the third normal conducting metal electrodes may be positioned on the side away from the $WTe_2$ layer.

Although the preferred embodiments and the like have been described in detail above, the present disclosure is not limited to the embodiments and the like described above, and various modifications and substitutions may be made to the embodiments and the like described above without departing from the scope described in the claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A quantum device comprising:

a $WTe_2$ layer that has a first surface and a second surface on an opposite side of the first surface;

a first insulating layer provided over the first surface;

a second insulating layer provided over the second surface;

a first normal conducting metal electrode, a second normal conducting metal electrode, and a third normal conducting metal electrode provided above the first insulating layer;

a first control circuit that controls a potential of the first normal conducting metal electrode, the second normal conducting metal electrode, and the third normal conducting metal electrode;

superconducting metal wiring that is provided above the second insulating layer and has a first end and a second end; and a second control circuit that controls a superconducting phase difference between the first end and the second end, wherein in planar view from a direction perpendicular to the first surface, the $WTe_2$ layer has a first edge and a second edge that constitute a constricted portion, the constricted portion is provided between the first edge and the second edge, the first normal conducting metal electrode overlaps a portion of the first edge away from the constricted portion to one side, the second normal conducting metal electrode overlaps a portion of the first edge away from the constricted portion to another side, and the third normal conducting metal electrode overlaps a portion of the second edge away from the constricted portion to one side.

2. The quantum device according to claim 1, wherein the superconducting metal wiring includes a loop that has a slit between the first end and the second end, and the second control circuit controls the superconducting phase difference by changing a magnetic flux in the loop.

3. The quantum device according to claim 2, wherein the second control circuit includes an alternating current circuit that changes the magnetic flux in the loop.

4. The quantum device according to claim 1, wherein the superconducting metal wiring includes:

a first loop portion that includes the first end; and a second loop portion that includes the second end and is subject to Josephson junction with the first loop portion, and the second control circuit controls the superconducting phase difference by changing a potential difference between the first loop portion and the second loop portion.

5. The quantum device according to claim 4, wherein the second control circuit includes a direct current power supply coupled between the first loop portion and the second loop portion.

6. The quantum device according to claim 1, wherein a plurality of the first normal conducting metal electrodes overlaps the portion of the first edge away from the constricted portion to the one side.

7. The quantum device according to claim 6, wherein a distance between the first normal conducting metal electrodes adjacent to each other in a direction along the first edge is equal to or more than 30 nm and equal to or less than 100 nm.

8. The quantum device according to claim 6, wherein a plurality of the second normal conducting metal electrodes overlaps the portion of the first edge away from the constricted portion to the another side.

9. The quantum device according to claim 8, wherein a distance between the second normal conducting metal electrodes adjacent to each other in a direction along the first edge is equal to or more than 30 nm and equal to or less than 100 nm.

10. The quantum device according to claim 1, wherein a plurality of the third normal conducting metal electrodes overlaps the portion of the second edge away from the constricted portion to the one side.

11. The quantum device according to claim 10, wherein a distance between the third normal conducting metal electrodes adjacent to each other in a direction along the second edge is equal to or more than 30 nm and equal to or less than 100 nm.

12. The quantum device according to claim 1, wherein a length of the first normal conducting metal electrode in a direction along the first edge is equal to or more than 100 nm and equal to or less than 500 nm.

13. The quantum device according to claim 1, wherein a length of the second normal conducting metal electrode in a direction along the first edge is equal to or more than 100 nm and equal to or less than 500 nm.

14. The quantum device according to claim 1, wherein a length of the third normal conducting metal electrode in a direction along the first edge is equal to or more than 100 nm and equal to or less than 500 nm.

15. The quantum device according to claim 1, wherein a distance between the first edge and the second edge in the constricted portion is equal to or more than 50 nm and equal to or less than 500 nm.

16. A method for controlling a quantum device that includes:

a $WTe_2$ layer that has a first surface and a second surface on an opposite side of the first surface;

a first insulating layer provided over the first surface;

a second insulating layer provided over the second surface;

a first normal conducting metal electrode, a second normal conducting metal electrode, and a third normal conducting metal electrode provided above the first insulating layer; and superconducting metal wiring that is provided above the second insulating layer and has a first end and a second end, wherein in planar view from a direction perpendicular to the first surface, the $WTe_2$ layer has a first edge and a second edge that constitute a constricted portion, the constricted portion is provided between the first edge and the second edge, the first normal conducting metal electrode overlaps a portion of the first edge away from the constricted portion to one side, the second normal conducting metal electrode overlaps a portion of the first edge away from the constricted portion to another side, and the third normal conducting metal electrode overlaps a portion of the second edge away from the constricted portion to one side, the method comprising:

controlling a potential of the first normal conducting metal electrode, the second normal conducting metal electrode, and the third normal conducting metal electrode; and controlling a superconducting phase difference between the first end and the second end.

17. The method according to claim 16, wherein the superconducting metal wiring includes a loop that has a slit between the first end and the second end, and the superconducting phase difference is controlled by changing of a magnetic flux in the loop.

18. The method according to claim 16, wherein the superconducting metal wiring includes:

a first loop portion that includes the first end; and a second loop portion that includes the second end and is subject to Josephson junction with the first loop portion, and the superconducting phase difference is controlled by changing of a potential difference between the first loop portion and the second loop portion.

* * * * *